(12) United States Patent
Kaushal et al.

(10) Patent No.: US 7,838,072 B2
(45) Date of Patent: Nov. 23, 2010

(54) METHOD AND APPARATUS FOR MONOLAYER DEPOSITION (MLD)

(75) Inventors: Sanjeev Kaushal, Austin, TX (US); Pradeep Pandey, San Jose, CA (US); Kenji Sugishima, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 1186 days.

(21) Appl. No.: 11/043,199

(22) Filed: Jan. 26, 2005

(65) Prior Publication Data

US 2006/0165890 A1 Jul. 27, 2006

(51) Int. Cl.
*C23C 16/00* (2006.01)
(52) U.S. Cl. .................. 427/255.28; 427/255.23; 427/255.7; 427/255.6; 427/248.1
(58) Field of Classification Search .... 427/248.1–255.7
See application file for complete search history.

(56) References Cited

U.S. PATENT DOCUMENTS

| | | | |
|---|---|---|---|
| 5,443,315 A | 8/1995 | Lee et al. | |
| 5,642,296 A | 6/1997 | Saxena | |
| 5,970,313 A | 10/1999 | Rowland et al. | |
| 6,195,621 B1 | 2/2001 | Bottomfield | |
| 6,351,723 B1 | 2/2002 | Maekawa | |
| 6,441,350 B1 | 8/2002 | Stoddard et al. | |
| 6,669,782 B1 | 12/2003 | Thakur | |
| 6,803,548 B2 | 10/2004 | Wang et al. | |
| 2002/0018849 A1 | 2/2002 | George et al. | |
| 2002/0081844 A1* | 6/2002 | Jeon et al. | 438/680 |
| 2003/0049372 A1* | 3/2003 | Cook et al. | 427/248.1 |
| 2003/0049390 A1* | 3/2003 | Shanmugasundram et al. | 427/585 |
| 2003/0134038 A1* | 7/2003 | Paranjpe | 427/248.1 |
| 2004/0038525 A1 | 2/2004 | Meng et al. | |
| 2004/0048451 A1* | 3/2004 | Marsh et al. | 438/478 |
| 2004/0110348 A1 | 6/2004 | Ahn et al. | |
| 2004/0216665 A1* | 11/2004 | Soininen et al. | 118/715 |
| 2005/0252884 A1 | 11/2005 | Lam et al. | |

FOREIGN PATENT DOCUMENTS

| | | |
|---|---|---|
| EP | 1422743 A1 | 5/2004 |
| WO | WO2005003406 A2 | 1/2005 |
| WO | 20070030193 A | 3/2007 |
| WO | 20070030194 A | 3/2007 |

OTHER PUBLICATIONS

European Patent Office, Search Report and Written Opinion, Jul. 19, 2006, 12 pages.
U.S. Patent and Trademark Office, Non-final Office Action received in corresponding U.S. Appl. No. 11/278,382 dated Sep. 19, 2008, 29 pages.
U.S. Patent and Trademark Office, Non-final Office Action received in corresponding U.S. Appl. No. 11/278,386 dated Sep. 15, 2008, 25 pages.
European Patent Office, International Search Report and Written Opinion received in related International Application No. PCT/US2007/065573, dated Aug. 20, 2007, 11 pages.
European Patent Office, International Search Report and Written Opinion received in related International Application No. PCT/US2007/065568, dated Aug. 17, 2007, 11 pages.
A. Emami-Naeaini et al., Model-based control for semiconductor and advanced materials processing: an overview; American Control Conference, 2004, vol. 5, Jun. 30, 2004, pp. 3902-3909.
Gordon, Roy G. et al., A kinetic model for step coverage by atomic layer deposition in narrow holes or trenches; Chemical Vapor Deposition, vol. 9, No. 2, Mar. 20, 2003, pp. 73-78.

* cited by examiner

*Primary Examiner*—Michael Cleveland
*Assistant Examiner*—Michael G Miller
(74) *Attorney, Agent, or Firm*—Wood, Herron & Evans, LLP

(57) ABSTRACT

An adaptive real time thermal processing system is presented that includes a multivariable controller. The method includes creating a dynamic model of the MLD processing system and incorporating virtual sensors in the dynamic model. The method includes using process recipes comprising intelligent set points, dynamic models, and/or virtual sensors.

38 Claims, 15 Drawing Sheets

METHOD AND APPARATUS FOR MONOLAYER DEPOSITION (MLD)

FIELD OF THE INVENTION

The invention relates to a method for depositing a film on a substrate in a semiconductor device, and more particularly, to a monolayer deposition (MLD) processing system.

BACKGROUND OF THE INVENTION

Several methods have been developed for creating thin films on substrates used in manufacturing semiconductor devices. Among the more established techniques is Chemical Vapor Deposition (CVD). Atomic Layer Deposition (ALD), a variant of CVD, is a relatively newer technology now emerging as a potentially superior method of achieving uniform, conformal film deposition.

ALD has demonstrated an outstanding ability to maintain ultra-uniform thin deposition layers over complex topology. This is at least partially true because ALD is not as flux dependent as is CVD. This flux-independent nature of ALD allows processing at lower temperatures than with conventional CVD methods.

The technique of ALD is based on the principle of the formation of a saturated monolayer of reactive precursor molecules by chemisorption. A typical ALD process for forming an AB film, for example, on a substrate consists of injecting a precursor or reactant A ($R_A$) for a period of time in which a saturated monolayer of A is formed on the substrate. Then, the precursor or reactant A ($R_A$) is purged from the chamber using an inert gas, $G_I$. This is followed by injecting precursor or reactant B ($R_B$) into the chamber, also for a period of time, to combine B with A thus forming the layer AB on the substrate. Then, the precursor or reactant B ($R_B$) is purged from the chamber. This process of introducing precursor or reactant A ($R_A$), purging the reactor, introducing precursor or reactant B ($R_B$), and purging the reactor can be repeated a number of times to achieve an AB film of a desired thickness.

However, conventional ALD processes suffer from several drawbacks. Since the film is created one layer at a time, film growth is much slower than CVD, often by an order of magnitude. This has a significant negative impact on process throughput.

In-situ measurements indicating when saturation of a precursor monolayer is completed on the substrate(s) are not available; this hinders the ability to control and optimize processing conditions to achieve optimal performance and throughput.

For typical batch reactors, single orifice injectors are used for introducing precursors into the reactor; this approach takes a longer time to fill the reactor with the precursors and hence may take a longer time to create the saturated monolayer on the multiple wafers located in the reactor.

SUMMARY OF THE INVENTION

The invention provides a method of operating a monolayer deposition (MLD) processing system comprising positioning a plurality of wafers in a processing chamber, and thereafter performing a first precursor process, a first purge process, a second precursor process, and a second purge process, and repeating the performing steps until a film having a desired thickness is deposited on the plurality of wafers. The first precursor process is controlled by a first process recipe having a first set of intelligent set points, the first set of intelligent set points establishing a first flow rate for a first precursor-containing gas during a first time period and establishing a second flow rate for the first precursor-containing gas during a second time period. The first purge process is controlled by a second process recipe having a second set of intelligent set points. The second precursor process is controlled by a third process recipe having a third set of intelligent set points, the third set of intelligent set points establishing a third flow rate for a second precursor-containing gas during a third time period and establishing a fourth flow rate for the second precursor-containing gas during a fourth time period. The second purge process is controlled by a process recipe having a fourth set of intelligent set points. The present invention further provides an apparatus for reducing the cycle time for the MLD process.

The invention also provides a monolayer deposition (MLD) processing system comprising means for positioning a plurality of wafers in a processing chamber, means for performing the first precursor process as controlled by the first process recipe, means for performing the first purge process as controlled by the second process recipe, means for performing the second precursor process as controlled by the third process recipe, means for performing the second purge process as controlled by the fourth process recipe, and means for repeating the performing steps until a film having a desired thickness is deposited on the plurality of wafers.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE INVENTION

Figure 1:
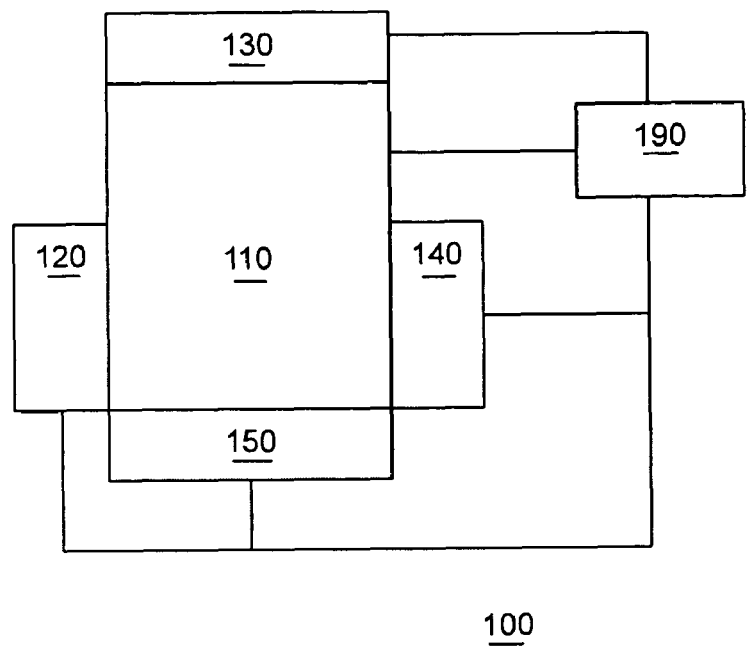
FIG. 1 shows a simplified block diagram of an MLD system in accordance with an embodiment of the invention.

FIG. 1 shows a simplified block diagram of an MLD system in accordance with an embodiment of the invention. In the illustrated embodiment, an MLD system 100 is shown that comprises an MLD reactor 110, a temperature control subsystem 120, a gas distribution subsystem 130, a pressure control subsystem 140, a sensor subsystem 150, and a controller 190. As shown in FIG. 1, the temperature control subsystem 120, gas distribution subsystem 130, pressure control subsystem 140, sensor subsystem 150, and controller 190 are coupled to the MLD reactor 110. In addition, the MLD reactor 110, temperature control subsystem 120, gas distribution subsystem 130, pressure control subsystem 140, sensor subsystem 150 can be coupled to the controller 190.

MLD reactor 110 can comprise a load/unload system (not shown) for loading and unloading semiconductor wafers W. MLD reactor 110 can process multiple wafers W at a time.

Temperature control subsystem 120 allows the temperature of the wafers W in the MLD reactor 110 to be controlled. Temperature control subsystem 120 allows the recipes to be run having one or more intelligent set points that establish different temperature at different points in time, and allows the temperature set points to be varied in time. For example, the temperature of the wafers can be changed during a purge step and/or changed during a precursor gas flow step, and the temperature ramps can be held within permissible bounds of the process requirements. In addition, the wafer temperature can be held constant during one or more process recipe steps.

The gas distribution subsystem 130 can control the precursor gas flow. The gas distribution subsystem 130 comprises means for controlling intelligent set points for the process gas flow rates, process gas composition, precursor type, and precursor concentration, and the set points can be varied in time to reduce the time it takes to create a saturated monolayer on the wafer(s). For example, one control method divides the associated gas flow step into a series of sub-steps—each sub-step having a different set of intelligent set points. In an alternate embodiment, a sub-step set point can be held constant during the precursor gas flow step.

The gas distribution subsystem 130 can also control the inert gas flow control. The gas distribution subsystem 130 comprises means for controlling the set points for the inert gas, such as flow control systems (FCSs) and/or mass flow controllers (MFCs) (not shown), and the set points can be varied in time to reduce the time it takes to dilute and purge the reactor. For example, one control method divides the associated inert gas flow step into a series of sub-steps—each sub-step having a different set of intelligent set points. In an alternate embodiment, a sub-step set point can be held constant during the inert gas flow step.

In addition, the gas distribution subsystem 130 can comprise multi-orifice injectors, discussed in more detail below. For example, single-walled and dual-walled multi-orifice injectors can be included in the reactor chamber for batch processes. Multi-orifice injectors can accelerate the delivery of precursors to the wafers thus reducing cycle time. Also, multi-orifice injectors can be used to accelerate the delivery of inert gas to the wafers during a purge process thus reducing cycle time.

The pressure control subsystem 140 is used to control the reactor 110 chamber pressure. The pressure control subsystem 140 comprises means for controlling the set points for the chamber pressure, and the pressure control set points can be varied in time to reduce the saturation and purge times. One control method divides the associated process step into a series of sub-steps—each sub-step having a different set of "intelligent" pressure control set points for controlling the pressure. In an alternate embodiment, a pressure control sub-step set point can be held constant during a process step.

For example, one method for controlling chamber pressure includes controlling the exhaust valve position. In one embodiment of the invention, the valve position is determined by a feed-forward control method—where the initial position is quickly changed to a desired valve and then the pressure control process is performed.

The sensor subsystem 150 can comprise a mass sensor and/or an optical monitoring. The sensor subsystem 150 can provide qualitative and quantitative analysis of the gaseous environment in the reactor 110. For example, sensor subsystem 150 can comprise a Gas Concentration Sensor (GCS). A GCS can be coupled to the fore line of the exhaust system (not shown) attached to the reactor 110, and the GCS can be used to determine at least one of a concentration level of precursor molecules, a concentration level of a process gas component, and a concentration level of a by-product of a process. The GCS can also be used to determine the endpoint for one or more process steps, such as gas flow steps.

Controller 190 can receive feed forward data for an incoming wafer from a processing system controller (not shown). Controller 190 can extract layer information from the feed forward data. Controller 190 can use the layer information to estimate the state of the wafers. For example, the controller 190 can establish process recipes for the incoming wafers based on the layer information and the temperature data that it receives. The controller 190 can then create process recipes having intelligent set points for the MLD system 100 using the methods described herein.

For example, controller 190 can comprise a computing means, a memory means, and an interface means capable of controlling the MLD system components. In addition, a program stored in the memory or loaded into the memory can be utilized to control the aforementioned components of a MLD system 100 according to a process recipe.

MLD system 100 can comprise sensors (not shown) that can be physical sensors and/or virtual sensors. These sensors can be the sources of measurement data used by the controller 190 and can be representative of the real-time conditions for various points in the MLD reactor 110. The controller 190 can use the measurement data to make decisions for controlling various processes in the MLD reactor 110. For example, a dynamic thermal model that is calculated by software and maintained in the memory of the controller 190 can comprise virtual sensors that can be used in lieu of actual physical sensors that cannot be reliably employed. However, a number of actual physical sensors can be employed to measure additional process parameters. The data from these physical sensors can be used by the controller 190 to adjust, verify, and/or correct the calculations in the dynamic thermal model.

According to certain embodiments of the invention, a digital simulation model of a MLD processing system that includes the wafers being processed is created. The model replicates the operating parameters of the system on a dynamic basis. For example, a model can calculate process parameters throughout the MLD system and the wafers being processed based on the flow characteristics of the MLD system and the wafers. It calculates "intelligent" set points for process recipes used in the MLD system. Actual measurements of process parameters at selected points in the system may be used to check and modify the calculations so that the model will operate correctly. The algorithms contained in the model can be derived theoretically or empirically, and preferably by a combination of those techniques. The derivations may be made by taking actual measurements on test wafers while operating the system through cycles of the process that is to be controlled.

The controller 190 can be configured to create and/or use dynamic models to control the MLD system 100. The controller 190 can be configured to create and/or use virtual sensors to control the MLD system 100. The controller 190 can be configured to create and/or use process recipes having intelligent set points to control the MLD system 100. Virtual sensors allow a user to "measure" process parameters/characteristics in real-time by calculating/estimating such process parameters/characteristics from virtual models of the system, thereby eliminating the need for instrumented wafers during production.

In addition, the controller 190 can be configured to analyze process data; to compare process data with predicted data, measured data, and/or historical process data; and to use the comparison to verify and/or change a dynamic model, virtual sensor, a process recipe, and/or an intelligent set point.

In addition, the controller 190 can be configured to analyze process data; to compare process data with predicted data, measured data, and/or historical process data; and to use the comparison to predict and/or declare an endpoint. Furthermore, the controller 190 can be configured to analyze process data; to compare process data with predicted data, measured data, and/or historical process data; and to use the comparison to predict and/or declare a fault.

Figure 2:
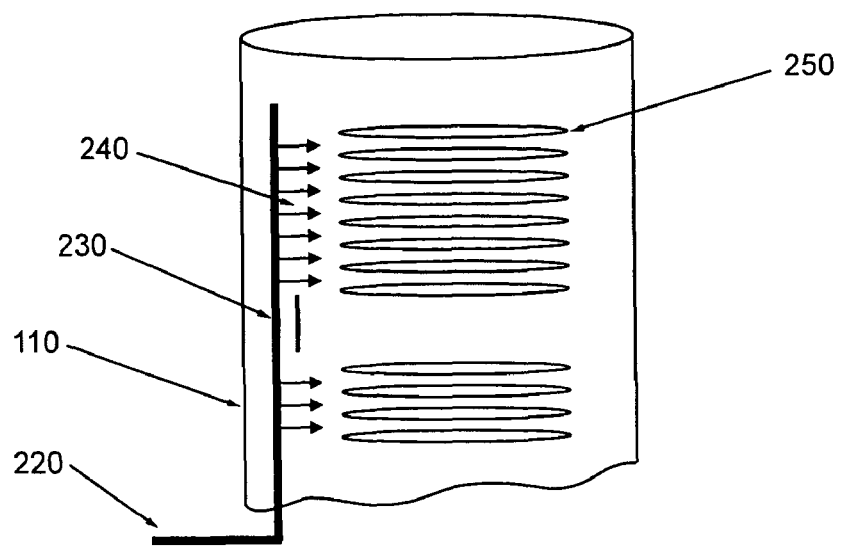
FIG. 2 shows an exemplary view of a multi-orifice injection system in accordance with an embodiment of the invention.

FIG. 2 shows an exemplary view of a multi-orifice injection system 200 in accordance with an embodiment of the invention. As mentioned above, the gas distribution subsystem 130 of FIG. 1 may comprise a multi-orifice injection system 200. As shown in FIG. 2, a multi-orifice injection system 200 can comprise supply line 220 coupled to the reactor 110, distribution means 230, and multiple injectors 240 for distributing gas throughout the reactor 110, which contains a batch of wafers 250.

Figure 3:
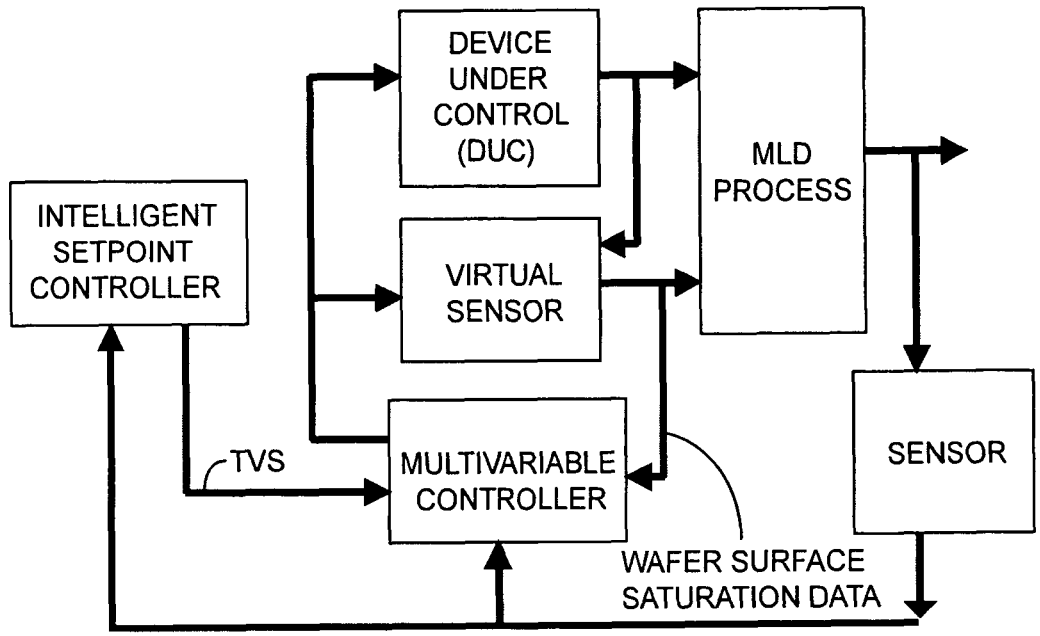
FIG. 3 illustrates a schematic representation of a MLD processing system including multivariable control in accordance with an embodiment of the invention.

FIG. 3 illustrates a simplified block diagram of a MLD processing system including an intelligent set point controller in accordance with an embodiment of the invention. In the illustrated embodiment, a device under control (DUC) is shown along with a virtual sensor, a multivariable controller, and an intelligent set point controller. For example, the DUC can be a MLD reactor, such as reactor 110 shown in FIG. 1.

In addition, the system includes the operation of a process and the use of a sensor as shown. For example, a process can be a MLD process, and the sensor can provide output data and/or error data from the MLD process. In one case, the sensor can be an optical sensor, and the optical sensor can provide thickness and composition data.

The intelligent set point controller can calculate and provide time varying intelligent set points to the multivariable controller. The intelligent set point controller and the multivariable controller can comprise hardware and software components.

The virtual sensor can provide wafer surface saturation data, wafer temperatures, and/or gas flow data to the multivariable controller.

Figure 4:
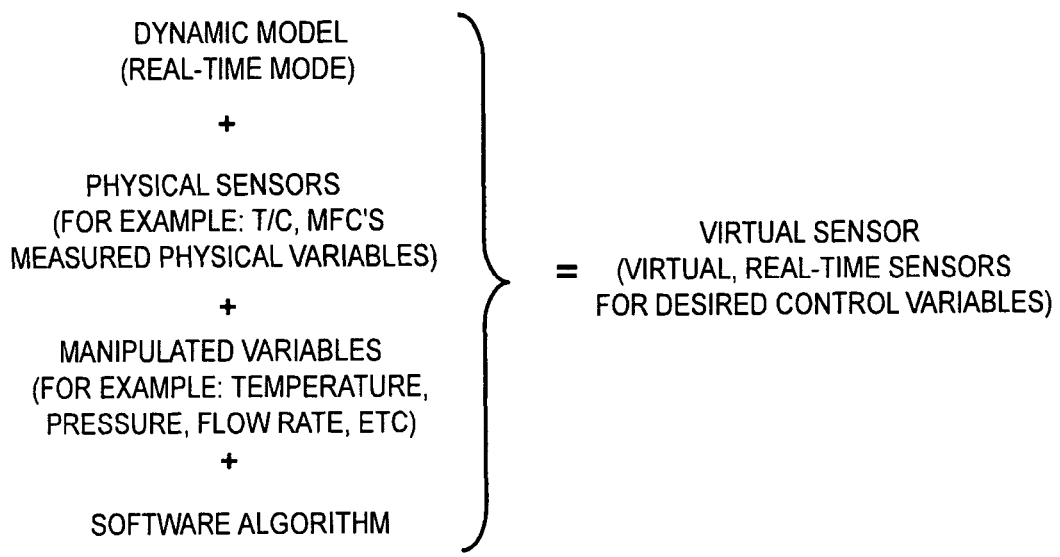
FIG. 4 illustrates a schematic representation of a virtual sensor in accordance with an embodiment of the invention.

FIG. 4 illustrates a schematic representation of a virtual sensor in accordance with an embodiment of the invention. In the illustrated embodiment, a virtual sensor is shown that comprises a dynamic model component, a physical sensor component, a manipulated variable component, and a software algorithm component.

The virtual sensor can be viewed as a compound device comprising an algorithm-based consolidation of information from multiple "physical" sensors. The virtual sensor is an adaptive device that can provide historical data, real-time data, and predictive data.

The virtual sensor allows un-measurable variables to be "measured" and controlled using measurable variables and models. A model is constructed detailing the dynamic interaction between measurable variables and un-measurable variables. Virtual sensing provides a method for obtaining wafer surface saturation data in real-time.

Virtual sensors eliminate the need for instrumented wafer(s) during production. For example, a dynamic "Gold" model and virtual sensors can be created once for the MLD system; the model can be tuned with a few wafers during initial qualification of specific equipment; and the system is then ready for production. Server based software can be used for any re-tuning.

Figure 5:
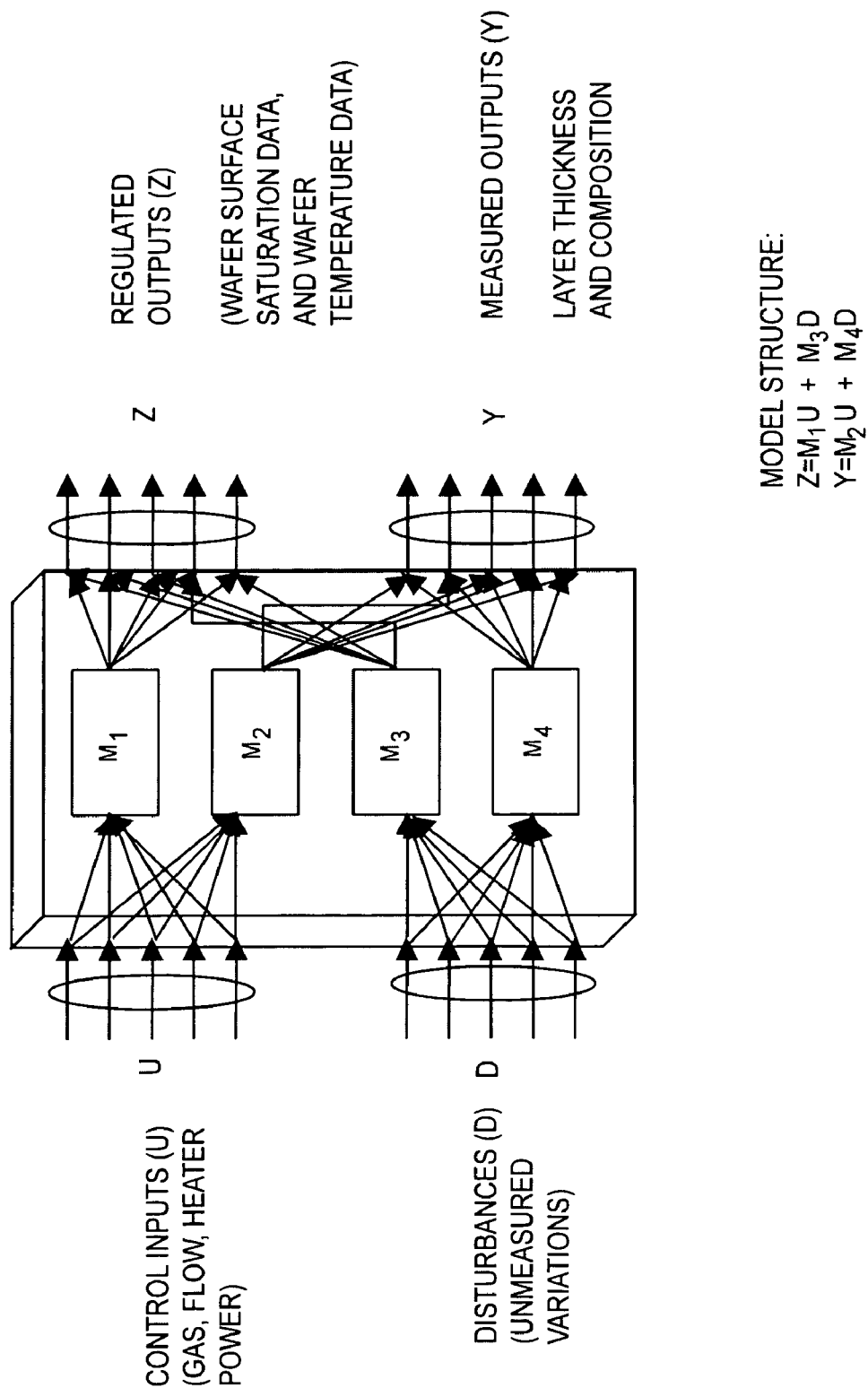
FIG. 5 illustrates a schematic representation of a dynamic model of a MLD processing system in accordance with an embodiment of the invention.

FIG. 5 illustrates a schematic representation of a dynamic model of a processing system in accordance with an embodiment of the invention. In the illustrated embodiment, four model components ($M_1$, $M_2$, $M_3$, and $M_4$) are shown. In alternate embodiments, a different number of components can be used and the components can be arranged in a different manner.

In addition, the dynamic model is shown having control inputs (U) and disturbance inputs (D), and having regulated outputs (Z) and measured outputs (Y). Also, the model structure is shown as: $Z=M_1U+M_3D$ and $Y=M_2U+M_4D$. Alternately, a different model can be used.

In the illustrated embodiment, the control inputs can comprise gas flow data and heater power data; the disturbance inputs can be unmeasured variations; the measured outputs can be chamber parameters and/or wafer data; and the regulated outputs can be the wafer surface conditions.

A Dynamic Model keeps track of the "State" of a system, and relates the inputs to outputs in real-time. For example, U, Y can be measured, and by using the models, D can be estimated using $Y=M_2U+M_4D_{est}$ and Z can be estimated using $Z_{est}=M_1U+M_3D_{est}$.

When creating dynamic models, a number of process variables, such as wafer position, chamber flow characteristics, gas flow rates, gas concentration, and wafer composition, can be incorporated into the model. The multivariable controllers can be used to determine the interaction between process variables at different times during the process, such as during the deposition and purge modes. The intelligent set point controller can be used to parameterize the nominal set points; create intelligent set points using an efficient optimization method and process data; and select appropriate models and set points during run-time.

One step in an intelligent set point control (ISC) methodology is to create models that describe the dynamic behavior of a processing system, such as a thermal processing system. These models can be used to design a multivariable controller and then for creating the sensitivity matrix and the intelligent set points.

One embodiment comprises creating dynamic models of the surface saturation conditions on the wafers being processed by the MLD system. In one case, the dynamic models can be tested and/or verified using instrumented wafers. A dynamic model can include the interaction between the gas flows in a multi-wafer chamber, the temperatures in a multi-wafer chamber, and the wafer surface characteristics. The dynamic model can be used to create a multi-variable controller that controls the estimated surface conditions for the wafers in real-time.

For example, a set of models can be created for the various wafer types to be processed—this can account for the wafer composition and can compensate in real-time for the variation in surface saturation response.

Figure 6:
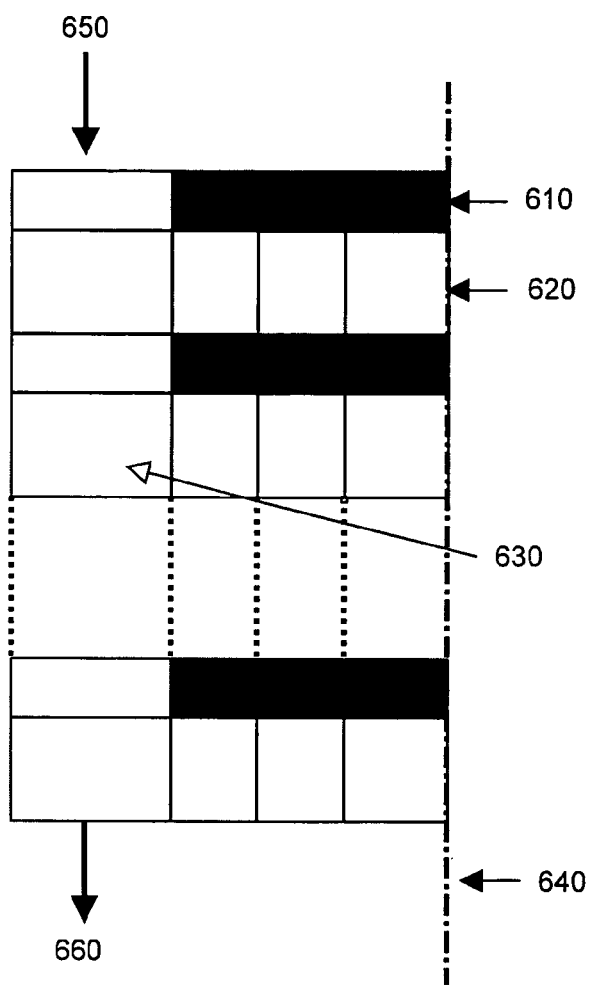
FIG. 6 shows an exemplary block diagram of a reactor model in accordance with an embodiment of the invention.

FIG. 6 shows an exemplary block diagram of a reactor model in accordance with an embodiment of the invention. In the illustrated embodiment, the reactor model comprises wafer elements 610, "between-wafer" elements 620, and wall elements 630. A reactor centerline 640 is shown along with a gas flow input 650 and a gas flow output 660.

As shown in FIG. 6, the reactor can be divided into finite volume elements including wall elements 630, between-wafer elements 620, and wafer elements 610. The number of wafer elements 610 is configurable. The gas flow can be modeled by assuming that both the gasses and precursors enter and exit the reactor axially symmetric. Surface saturation can be modeled by assuming that the surface flux is proportional to local precursor partial pressure.

In addition, the flow conditions assume that there is laminar flow in the reactor; convective "plug-flow" along reactor walls; and diffusion in the between-wafer space.

The wafer surface saturation model assumes that the surface flux is proportional to the local precursor partial pressure; chemisorption is proportional to flux; and the model tracks the state of the surface saturation.

The model includes configurable parameters that can be used to examine various reactors and flow regimes. The parameters are geometry-related, such as the number of wafers and the spacing between them. The parameters can include process conditions, such as pressure, temperature, and flow rates (inert and precursor). In addition, flow parameters, such as diffusivity, can be included. Furthermore, surface reaction parameters, such as the chemisorption rate, can be included.

To describe the gas flow and the chemisorption process, one can create a model of the reactor and the gas injection system. In this section, we illustrate the modeling method. It should be clear that a model could be created with other methods, including full computational fluid dynamics (CFD) methods.

In creating exemplary models, one or more of the following assumptions and/or simplifications can be made: one can assume that gases follow "ideal gas" laws with transport properties close to those of nitrogen, and one can neglect the thermal expansion of the gases as they enter the processing chamber. In addition, one can assume that Laminar flow conditions prevail in the chamber; that gas flow between the chamber wall and wafers is a plug-flow condition; and that between wafers, the primary transport mechanism is by diffusion of the reactant species in the carrier gas.

In addition, Fick's law can be used to model diffusion of the reactant species (precursors) between the wafers. Fick's law is written as:

$$\frac{\partial n}{\partial t} = D \frac{\partial^2 n}{\partial^2 x}$$

where,
n Precursor concentration
D Precursor diffusivity
x Distance
t Time

The plug flow can be described by calculating the flow velocity and thus the residence time in the chamber as:

$$u = \frac{F}{A}, \text{ and } t_{res} = \frac{u}{L}$$

where,
u Gas flow velocity
$t_{res}$ Residence time
F Flow rate
A Plug flow cross-sectional area
L Reactor length Using the model, one can input a desired flow rate F for a reactant species into the model and examine the following:

Local reactant/precursor concentration n: as the reactant/precursor is introduced in the chamber, the model keeps track of the local reactant/precursor concentration, and it is expressed in moles/cc.

Local saturation: as the surfaces are exposed to the reactant/precursor species, the chemisorption process binds the reactant/precursor molecules to the surface. Local saturation is expressed as a percentage, for example, from 0% to 100%.

Based on a model of the processing chamber, an exemplary set of results for the MLD process can be obtained for a particular set of parameters. For example, the following results can be obtained: 1) the convective gas flow velocity u can be approximately 20 cm/sec, and 2) the residence time $t_{res}$ can be approximately 2-3 seconds.

In one embodiment, models can be developed when flow rates are substantially constant, and in another embodiment, models can be developed when flow rate set points are allowed to vary over time. For example, a 150 second period can be assumed for the precursor exposure steps, and one method of the invention creates a series of flow rate set points that change over the 150 second period rather than holding the flow rate set point at a constant value. Alternately, a 150 second period is not required.

In each precursor exposure step ($R_A$ and $R_B$), precursor molecules can react with the surface until the surface is saturated. For example, precursors and process conditions can be chosen to stop a process step when the surface is completely saturated. Monolayer deposition processes sometimes use the self-limiting surface saturation aspect to control the film characteristics. For example, precursor steps can be made longer than necessary in order to ensure that the surface is saturated to slightly over-saturated with precursor molecules. In some cases, the process results can be relatively independent of slight variations in the amount of precursor supplied to the surface.

In the invention, the amount of precursor supplied is more intelligently controlled in order to shorten the time required for the precursor step and the time required for the purge step. For example, precursor flow within the chamber and between individual wafers in a stack, and pressure conditions within the chamber and at the surfaces of individual wafers in the stack can be included in the MLD model along with a number of other variables including precursor characteristics, surface characteristics, surface chemistry, purging processes, chamber design, and flow control within the chamber.

In this manner, a uniform thickness can be deposited in each deposition cycle. Since the film is grown in a layer-by-layer mode, and the total film thickness is determined by the number of deposition cycles, the use of intelligent set points in the invention increases the throughput by processing a number of wafers at one time and reducing the time required for each deposition cycle. In addition, using intelligent set points in the MLD process can provide improved uniformity and step coverage on wafers having high aspect ratio features. Furthermore, using intelligent set points in the MLD process can provide improved uniformity within high aspect ratio features including improved critical dimension (CD) control and profile uniformity control.

The MLD process and deposition rates can depend in part on wafer temperature. The MLD process temperature range can be wide. An upper limit can be established based on the temperature at which the precursors begin to thermally decompose. A lower limit can be established based on the temperature at which the deposition rate is slowed to a point at which increased impurity levels occur in the deposited film.

In addition, various methods can be used to optimize the models and the time-varying set points to minimize cycle time. For example, a test wafer can be used, and in another method, optical techniques can be used.

In one method for minimizing cycle time, Multi-Location Measurement Substrates (MLMSs) are used. A MLMS is a novel type of substrate that can measure in-situ the concentration of chemisorbed precursor species at multiple locations across the substrate.

Figure 7:
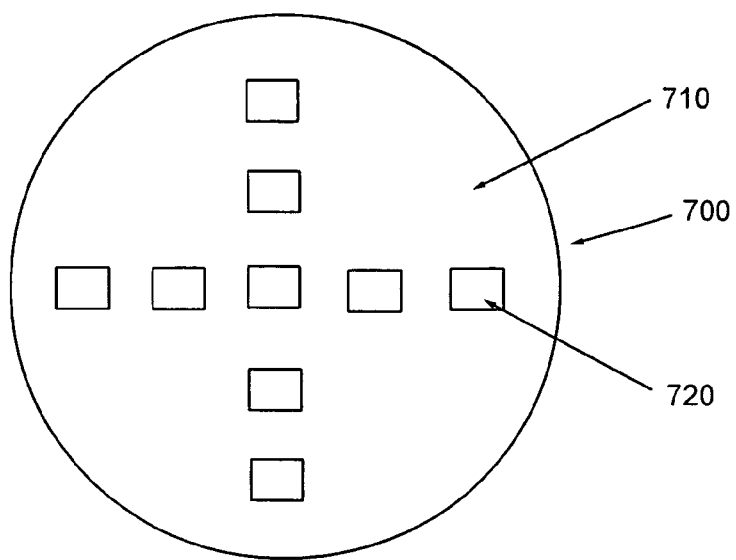
In FIG. 7, a Multi-location Measurement Substrate (MLMS) is shown in accordance with an embodiment of the invention.

In FIG. 7, a MLMS is shown in accordance with an embodiment of the invention. In the illustrated embodiment, a silicon wafer substrate may be used as MLMS 700, but this is not required for the invention. In an alternate embodiment, other materials can be used, such as glass. Substrate 700 has a substantially uniform first film 710 across the substrate. At selected locations, the substrate 700 has small areas of a second film 720. In the illustrated embodiment, nine locations are arranged in the center and in two concentric circles on the wafer, but this is not required. In alternate embodiments, any number of areas can be provided with a different type of material and different patterns. In FIG. 7, square shaped areas are shown, but this is not required. The areas can different shapes including geometric and non-geometric shapes.

On the MLMS 700, the chemisorption rate of the precursor on the first film 710 is different from the rate on the second film 720. When such a substrate is introduced in the reactor, the thickness of the precursor film formed on the substrate at the multiple measurement locations provides a measure of the net precursor flux at those locations.

MLMSs can be placed in a reactor to measure precursor chemisorption. For a multi-wafer and batch reactor, MLMSs can be placed in multiple locations in the wafer stack. In one embodiment, a MLMS can be placed at the top, middle, and bottom of the wafer stack. When these measurement substrates are located in the reactor, the value of the precursor gas flow set points can be manipulated to obtain values that minimize the cycle time.

In another method for minimizing cycle time, a GCS can be coupled to the fore line of the reactor. With this instrumentation, exhaust gas components can be measured, and the value of the precursor gas flow set points can be manipulated to obtain values that minimize the cycle time.

One embodiment of the invention provides a method wherein the precursors and the process gases are controlled using a process recipe having intelligent set points to provide "time-varying" gas flow rates. The process recipe having intelligent set points is designed to increase throughput by minimizing the wafer saturation time and the purge time.

The dynamic model can be verified and updated as follows: at the end of one or more time periods, one can measure/determine 1) the surface saturation state and 2) the molar species concentration state at three wafer locations in the stack—top, middle, and bottom, and the expected value for the surface saturation can be approximately one, and the expected value for the molar species concentration can be approximately zero.

The methodology includes: creating dynamic models that incorporate flow conditions, including local precursor concentration, and incorporate local chemisorption rate and surface saturation conditions; establishing a control procedure using Intelligent Set points Control (ISC) by parameterizing the nominal set points for the process parameters, and creating intelligent set points using an efficient optimization method and process data; and validating the control procedure on a reactor by using measured data (i.e. from instrumentation wafers) to check saturation state and refine and validate the dynamic models and/or the intelligent set points.

Figure 8:
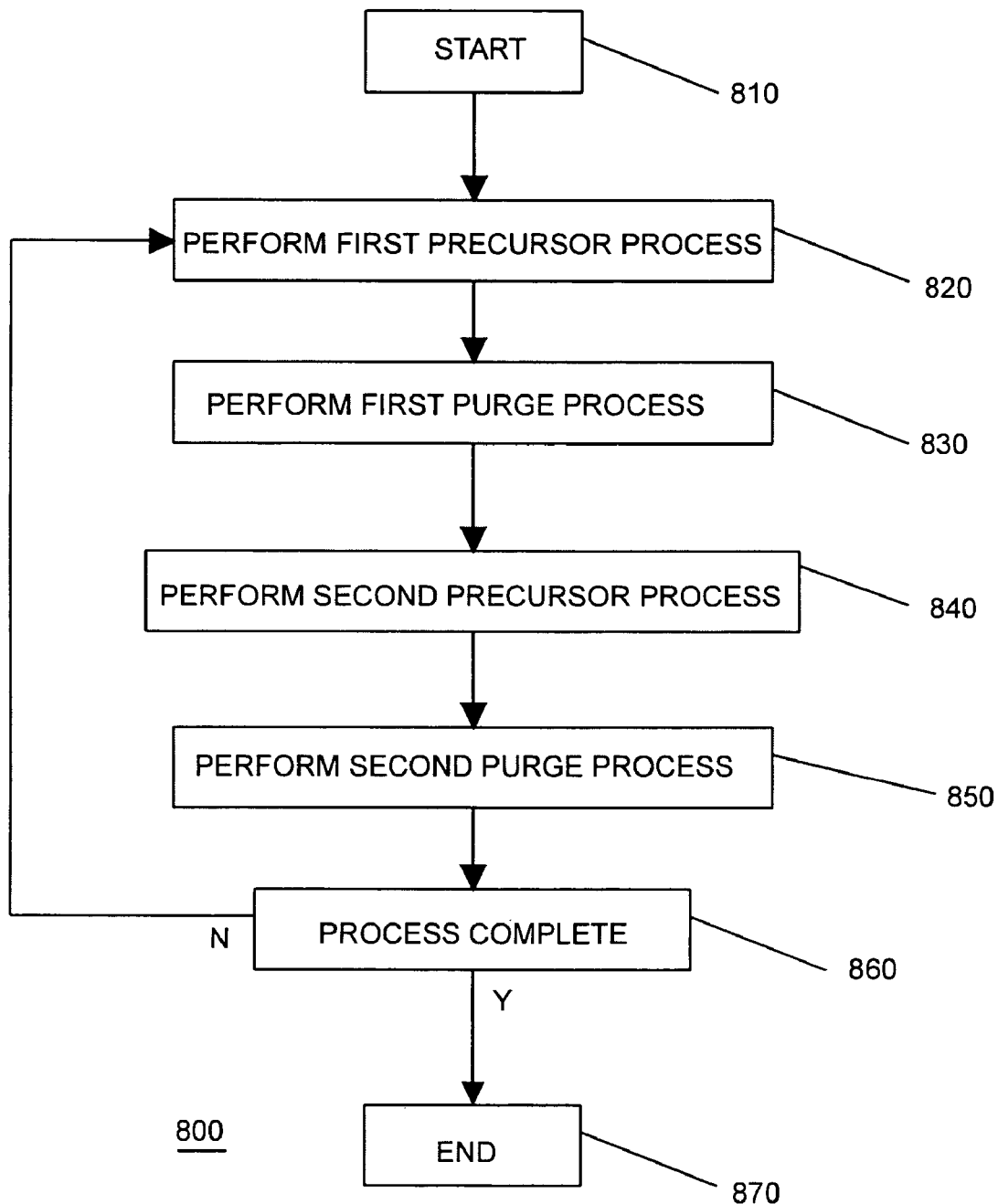
FIG. 8 illustrates a simplified flow diagram of a method for operating a monolayer deposition (MLD) processing system in accordance with an embodiment of the invention.

FIG. 8 illustrates a simplified flow diagram of a method 800 for operating a MLD processing system in accordance with an embodiment of the invention. Procedure 800 starts in step 810. For example, step 810 may include positioning a plurality of wafers in a processing chamber. A first precursor process 820 is then performed in the processing chamber, followed by a first purge process 830. A second precursor process 840 is then performed in the processing chamber, followed by a second purge process 850. A query is made in step 860 to determine if the MLD process is complete. If not, steps 820 to 850 are repeated. When the query of step 860 is positive, the procedure 800 ends, in step 870. Each of these steps will now be described in more detail.

In addition to positioning the wafer in the processing chamber, step 810 may also include receiving and processing feed forward data for at least one of a plurality of wafers. The feed forward data can include CD data, profile data, and optical data, such as refractive index (n) data and extinction coefficient (k) data. The feed forward data, for example, may be processed to extract therefrom wafer composition information. For example, wafer composition information can include the number of wafers, wafer position, number of layers, layer position, layer composition, layer uniformity, layer density, and layer thickness. Layers can include substrate material, resist material, dielectric material, and/or anti-reflective coating (ARC) material. In addition, n and k values for one or more layers can be extracted.

In step 820, a first deposition process can be performed. During the first deposition process, surface saturation zones can be determined on the surface of at least one of the plurality of wafers, and a virtual sensor can be created for determining one or more parameters for one or more surface saturation zones.

During the first deposition process, a first process gas can be introduced into the processing chamber, and the plurality of wafers can be exposed to a first reactant species contained in the first process gas. During the first process time, a uniform film is deposited onto the surfaces of the plurality of wafers. Furthermore, the first process time can be determined using at least one of the feed forward data and the virtual sensor. The virtual sensor can be used to determine when the surface saturation state (precursor concentration) has reached a desired value.

The virtual sensor can be created using a dynamic model having model components ($M_1$, $M_2$, $M_3$, and $M_4$), control inputs (U), disturbance inputs (D), regulated outputs (Z), and measured outputs (Y) as described in FIG. 5. The model structure may be expressed as $Z=M_1U+M_3D$ and $Y=M_2U+M_4D$. Alternately, a different expression for the model structure may be used.

For example, measured data can be obtained for U and Y; a value of D can be estimated using $Y=M_2U+M_4D_{est}$; and a value of Z can be estimated using $Z_{est}=M_1U+M_3D_{est}$. At least one control input (U) can be a gas flow for the first process gas, at least one disturbance input (D) can be an unmeasured variation, at least one measured output (Y) can be a gas concentration for the first process gas, and at least one regulated output (Z) can be a virtual sensor for determining a surface saturation state (precursor concentration). In alternative embodiments of the invention, a different number of model components may be used, and the model components may be arranged with a different architecture.

Measured data can be obtained for at least one of the regulated output; and the dynamic model can be verified using the measured data. In one case, the measured data can be obtained using a MLMS, which can measure in-situ the concentration of chemisorbed precursor species at multiple locations. Alternately, the measured data may be obtained using a GCS or other optical techniques.

In addition, the dynamic model can include: modeling the flow of the first process gas within the processing chamber, wherein the first process gas comprises a first reactant species (precursor molecules); modeling the flow between the wafers as a diffusion process; determining a residence time for the first reactant species (precursor molecules); determining a reactant species (precursor molecules) concentration for one or more surface saturation zones; and determining a chemisorption rate for one or more surface saturation zones.

For example, the surface saturation (precursor concentration) virtual sensor can measure percentages, and the first deposition process can end when the surface saturation reaches approximately 100 percent. In alternate embodiments, different percentages can be used. In some cases, the deposition process is dependent on saturated surface reactions between a substrate and a precursor. One case can be a self-limiting chemisorption reaction in which the deposition rate/cycle is determined by the saturation time and is independent of the reactant exposure time after saturation.

In a typical recipe, process parameter set points, such as the flow rate of a precursor-containing gas (approximately 250 sccm), and chamber pressure (approximately 1 Torr) are held constant for a given period. The invention, however, uses intelligent set points that are dynamic and that can vary the flow rate around a nominal value as a function of time to provide additional degrees of freedom in achieving film uniformity. In alternate embodiments, intelligent set points can be used to control other process parameters, such as chamber pressure, chamber temperature, and substrate temperature during the first deposition process in step 820. In additional embodiments, a nominal value is not required. In other embodiments, a different nominal value can be used.

In one embodiment, the precursor concentration can be determined using radial elements (n) on at least one wafer and a precursor concentration vector D can be defined at each one of the radial elements (n). Alternately, non-circular items can be processed and non-radial elements can be used.

$$D = \begin{bmatrix} D_1 \\ \vdots \\ D_n \end{bmatrix}$$

Variations in the precursor concentration vector D may be minimized by using the dynamic set point trajectories. A model-based linear or nonlinear multivariable control approach may be used to model the precursor concentrations in which the controller comprises a mathematical model of the system to be controlled. The multivariable controller may be based on any of the modern control design methods such as linear-quadratic-gaussian (LQG) method, linear quadratic regulator (LQR) method, H-infinity (H-inf) method, etc. The precursor concentration model may be either linear or non-linear and either single input single output (SISO) or multiple input multiple output (MIMO). The multivariable control approach (i.e., MIMO) considers all inputs and their effects on the outputs. Several other approaches for modeling the precursor concentrations are available, such as physical models, and data-driven models.

In one embodiment, the precursor flow rate set points are allowed to vary in a small window around the nominal value during the first precursor process step 820, and this provides additional degrees of freedom in achieving end-of-run precursor concentration uniformity. In other embodiments, additional set points are used during the first precursor process step 820. When modeling the precursor concentration using intelligent time-varying set point trajectories, the nominal set points for precursor flow rates can be parameterized into a vector of breakpoints, and can define a vector r that contains intelligent set points ($r_1$-$r_m$) for precursor flow rates which are time-varying perturbations around the nominal set points:

$$r = \begin{bmatrix} r_1 \\ \vdots \\ r_m \end{bmatrix}$$

Alternately, one or more process variables can have intelligent time-varying set points, when intelligent set points are used during the first precursor process 820. For example, intelligent set points can be used to control chamber temperature, chamber pressure, process gas chemistry, and wafer temperature.

A process sensitivity matrix M can be created by making small perturbations at each of the breakpoints for each control zone. Using the model of the closed-loop system, the results caused by these perturbations can be determined. The resultant perturbations ($d_1$-$d_n$) in one process characteristic, such as saturation state, can then be written in vector form as:

$$\begin{bmatrix} d_1 \\ \vdots \\ d_n \end{bmatrix} = M \begin{bmatrix} r_1 \\ \vdots \\ r_m \end{bmatrix}$$

Now, the optimization task becomes one of finding the appropriate values of vector r, such that the resultant vector d removes the across-wafer variations seen in the precursor concentration vector D obtained from the nominal trajectory. For example, measured data can be used to compute the sensitivity matrix M.

When creating intelligent set points, the resultant uniformity of the deposited layer on the wafers depends significantly on the deposition rate, which in turn depends on the saturation rate, the wafer temperature, the precursor concentration, and the partial pressure at various locations on the wafer surface. Methods for computing the saturation rate at across-wafer locations and the sensitivity of the surface saturation rate to flow set point variations have been described above. The nominal saturation state values ($C_1$-$C_n$) can be proportional to the nominal precursor concentration levels ($D_1$-$D_n$), where α is the proportionality constant. In addition, the variation in the saturation state values ($c_1$-$c_n$) can be proportional to variation in the precursor concentration levels ($d_1$-$d_n$), where α is the proportionality constant. Then, variation in the saturation state values can be written as:

$$\begin{bmatrix} c_1 \\ \vdots \\ c_n \end{bmatrix} = \alpha \cdot M \begin{bmatrix} r_1 \\ \vdots \\ r_m \end{bmatrix}$$

The variation in the saturation state values ($c_1$-$c_n$) and/or the variation in the precursor concentration levels ($d_1$-$d_n$) across the surfaces of the wafers may be reduced by computing intelligent set point using the sensitivity matrix M. The intelligent set points may be optimized by solving a constrained quadratic optimization problem given by:

$r_{min}\|d-\alpha \cdot Mr\|$, where $r_{min} < r$, $r < r_{max}$

Thus, the procedure to find the intelligent set points becomes:

1) Run the process using the nominal set points and find the precursor concentration levels and/or saturation state values across the surface of at least one wafer at the selected locations. Precursor concentration levels can be measured using several methods; one such method is using optical sensors (Optical Emissions Spectroscopy (OES), Optical Digital Profilometry (ODP)); another method can use a MLMS.

2) Select the nominal value of the precursor concentration and create the variation vector d, which is the difference between a desired value and the measurement data. In one embodiment, the desired value is the nominal value. Alternately, the desired value may be an average value, a minimum value, a maximum value, a 3-sigma value, or another computed value.

3) Solve the optimization problem shown above to find the intelligent set points, r.

4) Update the recipe with the intelligent set points found in the previous step and re-run the process. For example, updated values may be obtained by running an updated recipe.

5) Iterate until the desired uniformity is achieved. For example, the desired uniformity can comprise a 3-sigma value for a precursor concentration variation. Alternately, the desired uniformity may be an average value, a minimum value, a maximum value, or another computed value.

After the iteration has converged and the desired uniformity is achieved, the results may be stored for subsequent use.

Figure 9:
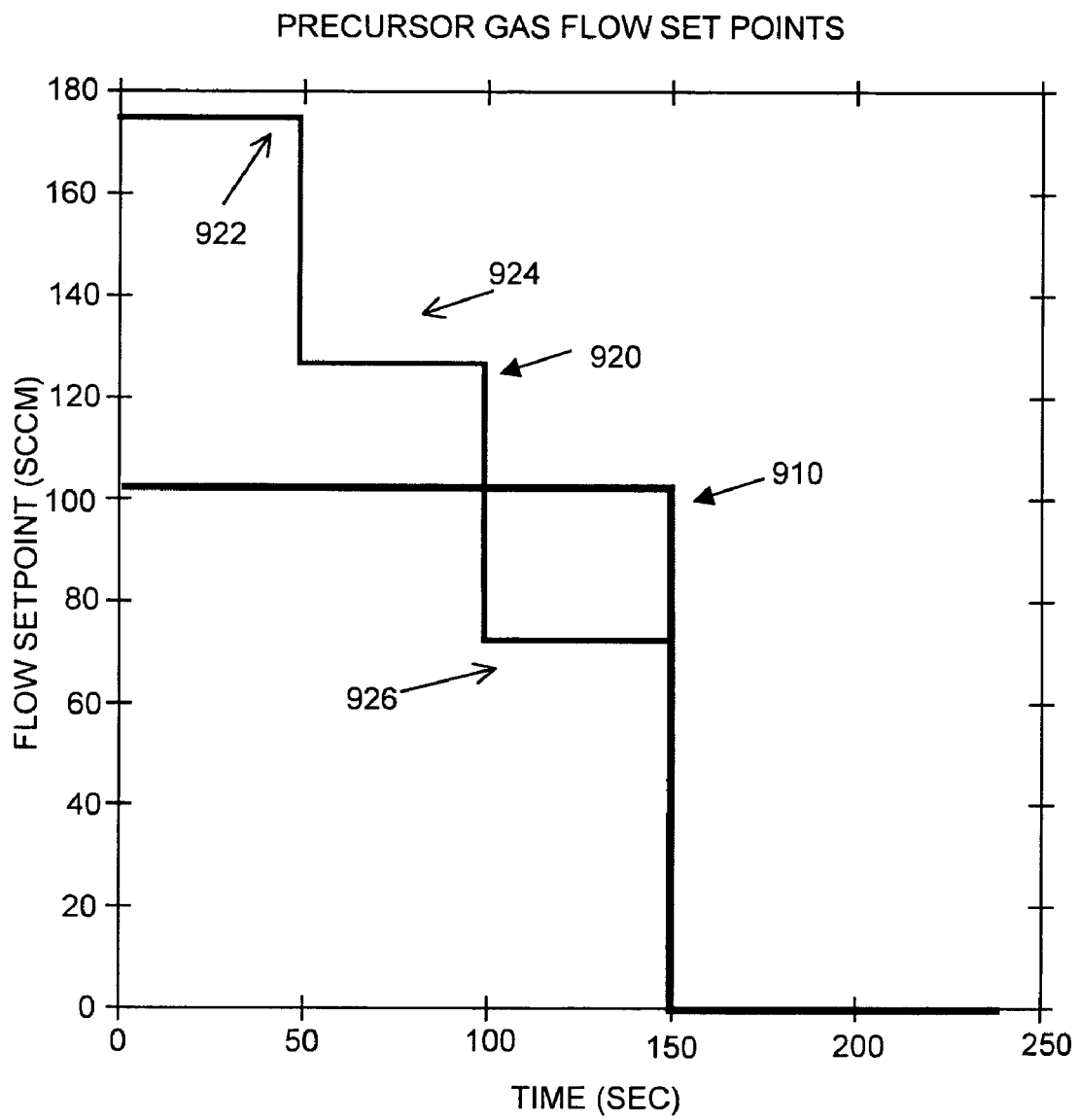
FIG. 9 illustrates a recipe step including gas flow rates for a first precursor-containing gas in accordance with an embodiment of the invention.

FIG. 9 illustrates a recipe step including gas flow rates for a first precursor-containing gas in accordance with an embodiment of the invention. A constant flow rate 910 is shown that is typical of a commonly used ALD process of the prior art. A flow rate 920 having intelligent set points (922, 924, and 926) exemplifies an embodiment of the invention for operating a MLD process. In alternate embodiments, a different number of intelligent set points can be used. In addition, different flow rate values can be used, and different times can be used.

Figure 10:
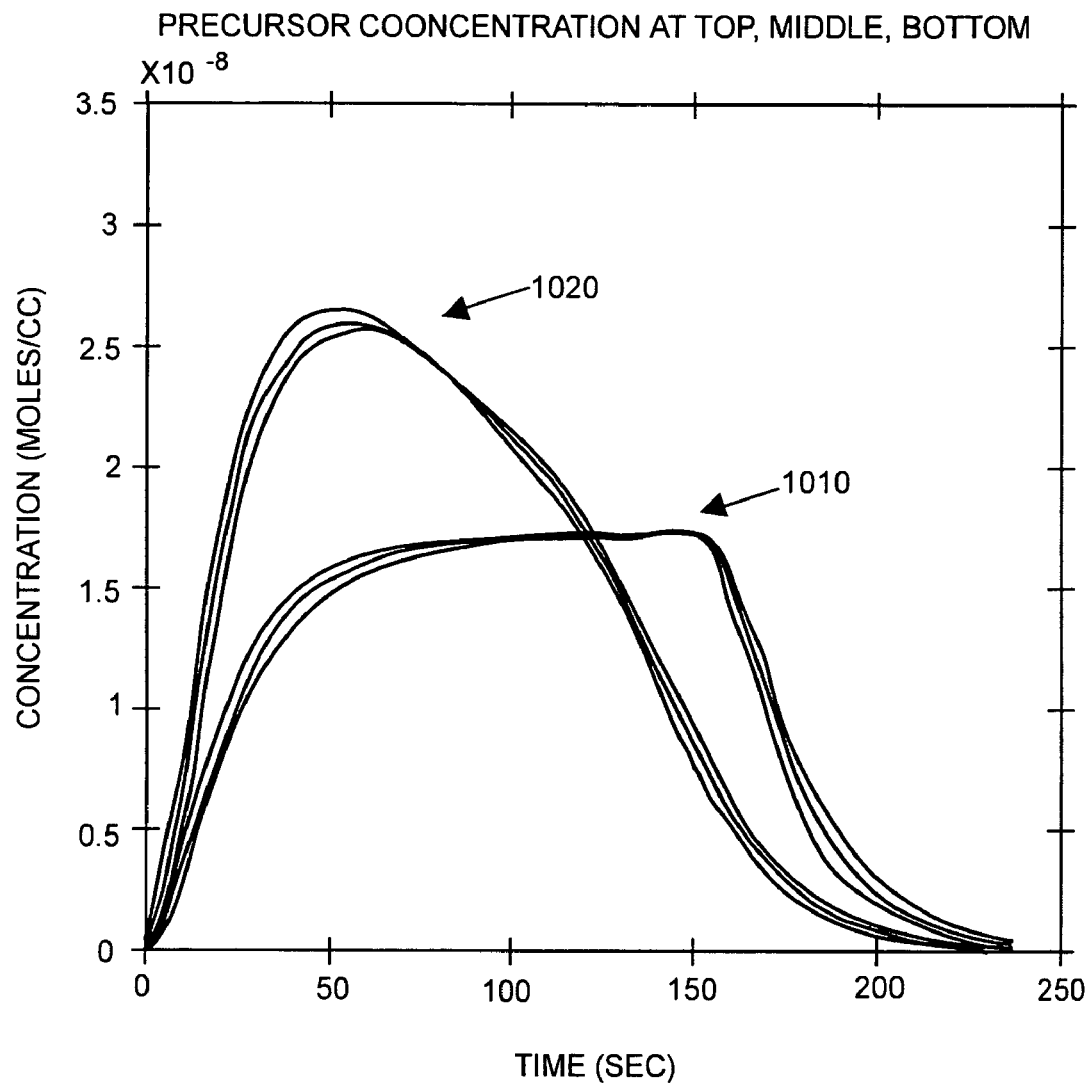
FIG. 10 illustrates concentration values for the first precursor in accordance with an embodiment of the invention.

FIG. 10 illustrates concentration values for the first precursor in accordance with an embodiment of the invention. Precursor concentration values 1010 are shown that are typical of a commonly used ALD process of the prior art in which the flow rate is held constant. Precursor concentration values 1020 are shown that exemplify an embodiment of the invention in which intelligent set points are used for operating a MLD process. In both cases (1010 and 1020), data is shown for wafers at the top, middle, and bottom of the stack. In alternate embodiments, different precursor concentration values can be used, and different times can be used.

Figure 11:
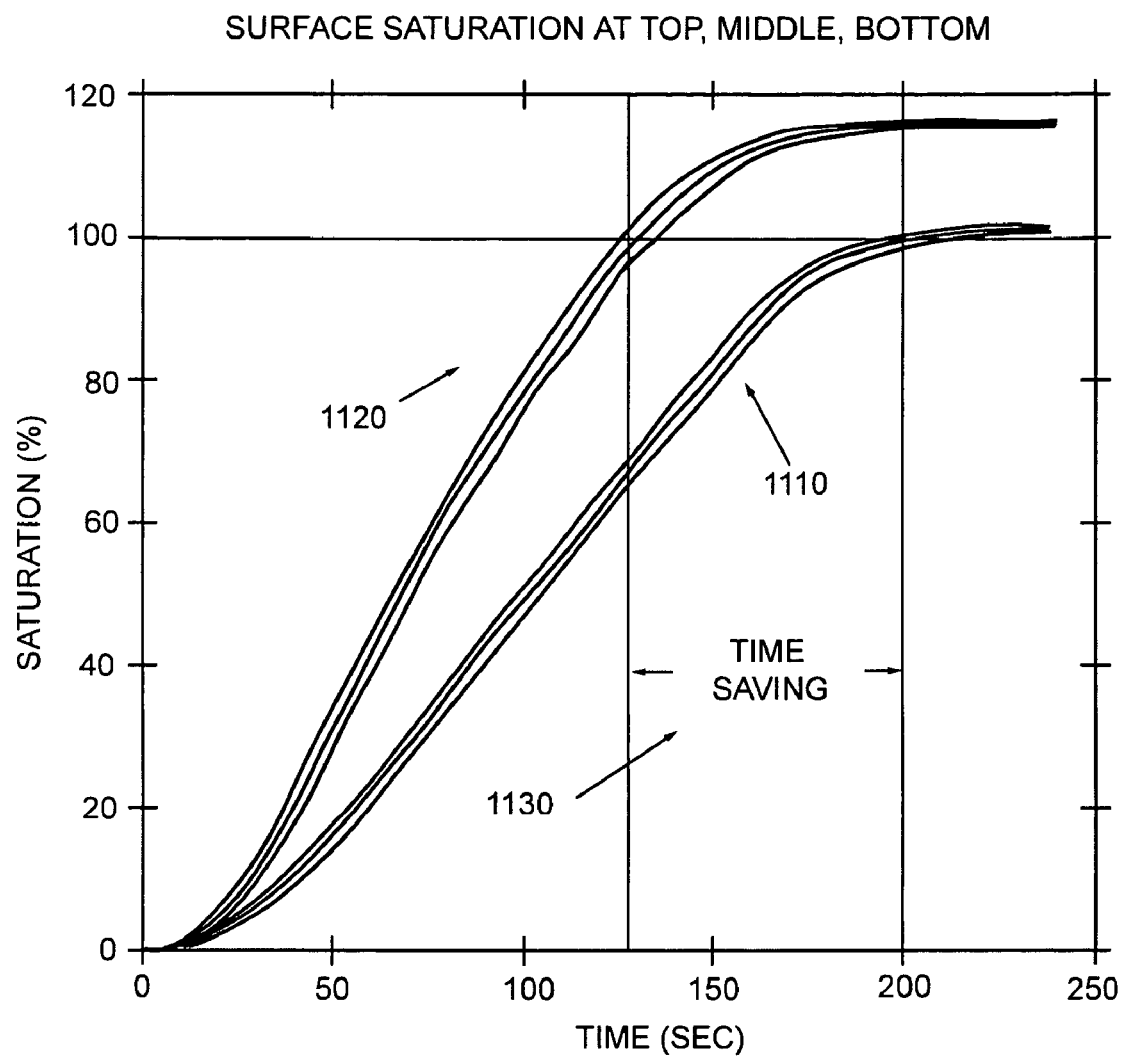
FIG. 11 illustrates surface saturation values for the first precursor in accordance with an embodiment of the invention.

FIG. 11 illustrates surface saturation values for the first precursor in accordance with an embodiment of the invention. Surface saturation values 1110 are shown that are typical of a commonly used ALD process of the prior art in which the flow rate is held constant. Surface saturation values 1120 are shown that exemplify an embodiment of the invention in which intelligent set points are used for operating a MLD process. In both cases (1110 and 1120), data is shown for wafers at the top, middle, and bottom of the stack. In alternate embodiments, different surface saturation values can be used, and different times can be used.

In addition, a time difference 1130 is shown that exemplifies the time savings obtained using an embodiment of the invention. Specifically, in this example, 100% saturation was achieved 75 seconds faster by virtue of the present invention. The use of intelligent set points provides a substantial time saving.

Referring again to FIG. 8, in step 830, a first chamber purging process can be performed. For example, a chamber purging process can include at least one of a chamber venting process, a chamber cleaning process, and an evacuation process. During the first chamber purging process 830, surface saturation zones can be determined on the surface of at least one of the plurality of wafers, and a second virtual sensor may be created for determining one or more parameters for one or more surface saturation zones. A second process gas can be introduced into the processing chamber during a second process time, and the second process gas can substantially eliminate the first process gas from the process chamber. For example, this can cause the concentration of the first reactant species (precursor) at each surface saturation zone to be approximately zero. The second process time can be determined using at least one of the virtual sensor, the second virtual sensor, a concentration value, feed forward data, and measured data.

The second virtual sensor can be used to determine when at least one of a concentration level of un-reacted first precursor molecules, a concentration level of the first process gas, a concentration level of the second process gas, and a concentration level of by-products from the process reaches a desired value. In one embodiment, the desired value can be approximately zero. In alternate embodiments, the desired value can be greater than zero.

The second virtual sensor can be created using a dynamic model having model components ($M_1$, $M_2$, $M_3$, and $M_4$), control inputs (U), disturbance inputs (D), regulated outputs (Z), and measured outputs (Y) as described in FIG. 5. The model structure may be expressed as $Z=M_1U+M_3D$ and $Y=M_2U+M_4D$. Alternately, a different expression for the model structure may be used.

For example, measured data can be obtained for U and Y; a value of D can be estimated using $Y=M_2U+M_4D_{est}$; and a value of Z can be estimated using $Z_{est}=M_1U+M_3D_{est}$. At least one control input (U) can be a gas flow for the second process gas, where the second process gas comprises an inert gas, at least one disturbance input (D) can be an unmeasured variation, at least one measured output (Y) can be an un-reacted precursor concentration for the gas leaving the processing chamber, and at least one regulated output (Z) can be a virtual sensor for determining at least one of a concentration level of un-reacted first precursor molecules, a concentration level of the first process gas, and a concentration level of by-products from the first process gas at one or more surface saturation zones.

Measured data can be obtained for at least one of the regulated output; and the dynamic model can be verified using the measured data. In one embodiment, the measured data may be obtained using a GCS. In another embodiment, other measurement devices can be used. In an alternate embodiment, the GCS can be used as the endpoint detector for one or more process steps. Alternately, the measured data may be obtained using a MLMS.

The second virtual sensor can measure percentages, and the first chamber purging process in step 830 can end when the second virtual sensor value reaches approximately zero percent. In alternate embodiments, different percentages can be used, and different concentration levels can be used. In some cases, the purging process is dependent on the flow rates into the chamber, the flow rates out of the chamber, the flow rates within the chamber, and on the flow rates between the substrates.

In a typical recipe, process parameter set points, such as the flow rate of a purge gas, and chamber pressure are held constant for a known time during a purging process.

The invention, however, uses intelligent set points that are dynamic and that can vary the purge gas flow rate around a nominal value as a function of time to provide additional degrees of freedom in achieving film uniformity and faster processing times. In alternate embodiments, intelligent set points can be used to control other process parameters, such as chamber pressure, chamber temperature, and substrate temperature during the first purge process 830. In additional embodiments, a nominal value is not required. In other embodiments, a different nominal value can be used.

In one embodiment, the first purge step 830 is used to remove contaminants, such as the first process gas components, precursor molecules, and/or process by-products from the wafer surfaces and from the processing chamber. Various reaction parameters can be combined with the dynamic model to determine the concentration levels for the contaminants at various locations during the first purge process 830. The concentration levels of the contaminants can be more accurately controlled by including intelligent set points to control the flow rate of the purge gas during the first chamber purging process 830.

In one embodiment, a contamination level (concentration) can be determined using radial elements (n) on at least one wafer. A contamination level can comprise at least one of a concentration level for reacted first precursor molecules, a concentration level for un-reacted first precursor molecules, a concentration level for the first process gas, and a concentration level for the by-products from the first process. A contamination level (concentration) vector D can be defined at each one of the radial elements (n). Alternately, non-circular items can be processed and non-radial elements can be used.

$$D = \begin{bmatrix} D_1 \\ \vdots \\ D_n \end{bmatrix}$$

Variations in the contamination level vector D may be minimized by using the dynamic set point trajectories. A model-based linear or nonlinear multivariable control approach may be used to model the contamination levels in which the controller comprises a mathematical model of the system to be controlled. The multivariable controller may be based on any of the modern control design methods as described herein. The model of the contamination levels may be either linear or nonlinear and either SISO or MIMO. The multivariable control approach (i.e., MIMO) considers all inputs and their effects on the outputs. Several other approaches for modeling the contamination levels are available, such as physical models, and data-driven models.

In one embodiment, the flow rate set points for the second process gas are allowed to vary in a small window around the nominal value during the first purge process step 830, and this provides additional degrees of freedom in achieving faster and more efficient purging. In other embodiments, additional set points can be used during the first purge process step 830. When modeling the contamination levels using intelligent time-varying set point trajectories, the nominal set points for flow rates for the second process gas can be parameterized into a vector of breakpoints; and can define a vector r, that contain intelligent set points ($r_1$-$r_m$) for flow rates for the second process gas which are time-varying perturbations around the nominal set points:

$$r = \begin{bmatrix} r_1 \\ \vdots \\ r_m \end{bmatrix}$$

Alternately, one or more process variables can have intelligent time-varying set points, when intelligent set points are used during the first purge process 830. For example, intelligent set points can be used to control chamber temperature, chamber pressure, process gas chemistry, and wafer temperature.

A process sensitivity matrix M can be created by making small perturbations at each of the breakpoints for each control zone. Using the model of the closed-loop system, the results caused by these perturbations can be determined. The resultant perturbations ($d_1$-$d_n$) in one process characteristic, such as the contamination levels (concentrations), can then be written as:

$$\begin{bmatrix} d_1 \\ \vdots \\ d_n \end{bmatrix} = M \begin{bmatrix} r_1 \\ \vdots \\ r_m \end{bmatrix}$$

Now, the optimization task becomes one of finding the appropriate values of vector r, such that the resultant vector d removes the across-wafer variations seen in the contamination level (concentration) vector D obtained from the nominal trajectory. For example, measured data can be used to compute the sensitivity matrix M.

When creating intelligent set points, the resultant uniformity of the deposited layer on the wafers depends significantly on the effectiveness of the purge process 830, which in turn depends on the flow rate for the purge gas. Methods for computing the contamination levels at across-wafer locations and the sensitivity of the contamination levels to purge gas flow set point variations have been described above. In one embodiment, nominal contamination state values ($C_1$-$C_n$) may be proportional to the nominal contamination levels ($D_1$-$D_n$), where α is the proportionality constant. In addition, the variation in the contamination state values ($c_1$-$c_n$) can be proportional to variation in the contamination levels ($d_1$-$d_n$), where α is the proportionality constant. Then, variation in contamination state values ($c_1$-$c_n$) can be written as:

$$\begin{bmatrix} c_1 \\ \vdots \\ c_n \end{bmatrix} = \alpha \cdot M \begin{bmatrix} r_1 \\ \vdots \\ r_m \end{bmatrix}$$

The variation in the contamination state values ($c_1$-$c_n$) and/or the variation in the contamination levels ($d_1$-$d_n$) across the surfaces of the wafers may be reduced by computing intelligent set points using the sensitivity matrix M. The intelligent set points may be optimized by solving a constrained quadratic optimization problem given by:

$$r_{min} \| d - \alpha \cdot Mr \|, \text{ where } r_{min} < r, r < r_{max}$$

Thus, the procedure to find the intelligent set points becomes:

1) Run the process using the nominal set points and find the contamination levels and/or contamination state values across the surface of at least one wafer at the selected locations. The contamination levels can be determined using several methods; one such method uses known gas analysis techniques; another method can use a GCS. Alternately, the measured data may be obtained using a MLMS.

2) Select the nominal value of the contamination levels and create the variation vector d, which is the difference between the desired value and the measurement data. In one embodiment, the desired value is a nominal value. Alternately, the desired value may be an average value, a minimum value, a maximum value, a 3-sigma value, or another computed value.

3) Solve the optimization problem shown above to find the intelligent set points, r.

4) Update the recipe with the intelligent set points found in the previous step and re-run the process. For example, updated values may be obtained by running an updated recipe.

5) Iterate until the desired contamination level is achieved. For example, the desired contamination level can comprise at least one of a 3-sigma value, a maximum value, a minimum value, and an average value. After the iteration has converged and the desired uniformity is achieved, the results may be stored for subsequent use. At the completion of step 830, excess materials have been purged out of the chamber and a monolayer of the first precursor material has been adsorbed on the surface of the plurality of wafers.

Figure 12:
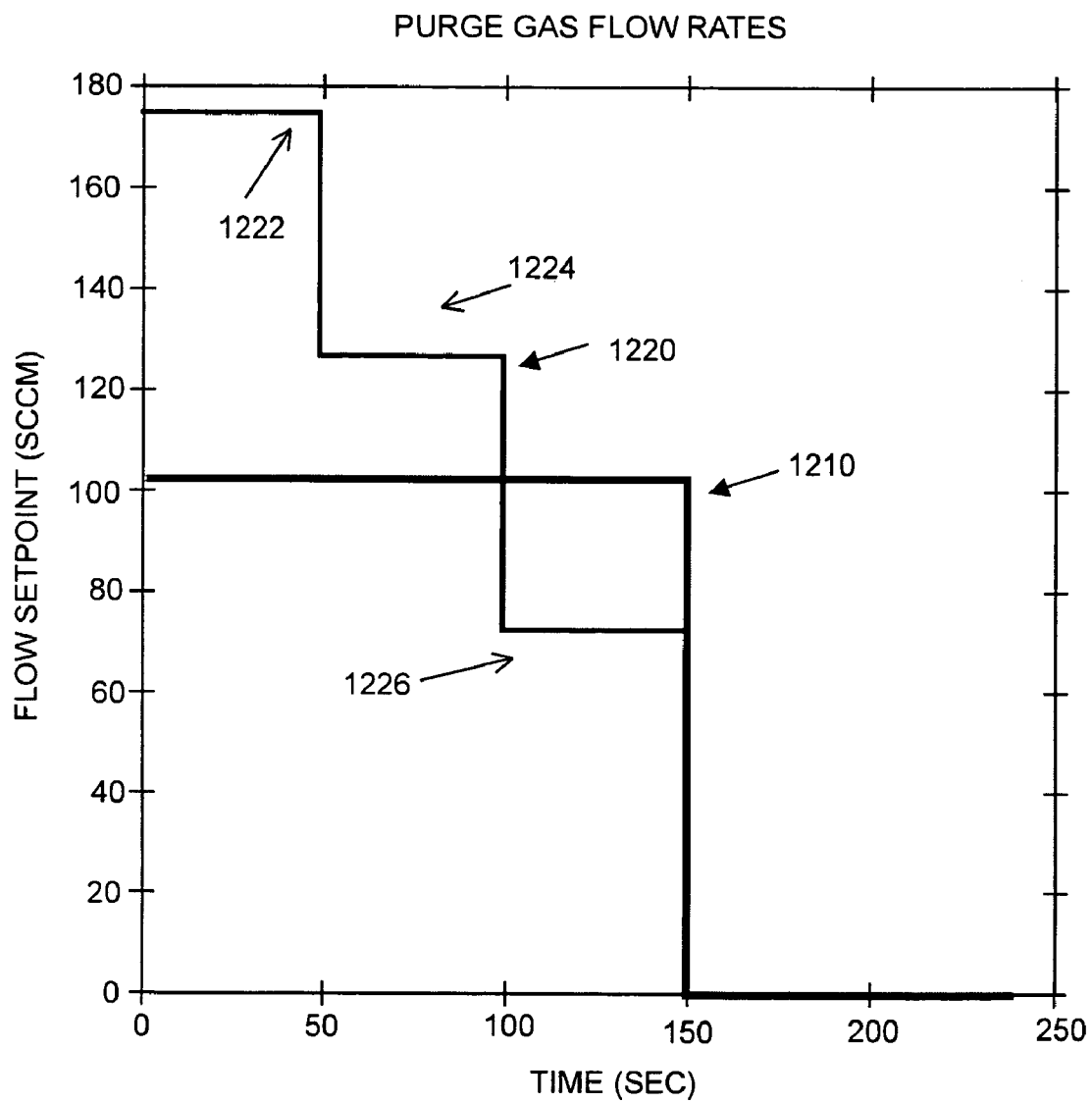
FIG. 12 illustrates a recipe step including gas flow rates for a first purge gas in accordance with an embodiment of the invention.

FIG. 12 illustrates a recipe step including gas flow rates for a first purge gas in accordance with an embodiment of the invention. A constant flow rate 1210 is shown that is typical of a commonly used ALD process of the prior art. A flow rate 1220 having intelligent set points (1222, 1224, and 1226) exemplifies an embodiment of the invention for operating a MLD process. In alternate embodiments, a different number of intelligent set points can be used. In addition, different flow rate values can be used, and different times can be used.

Figure 13:
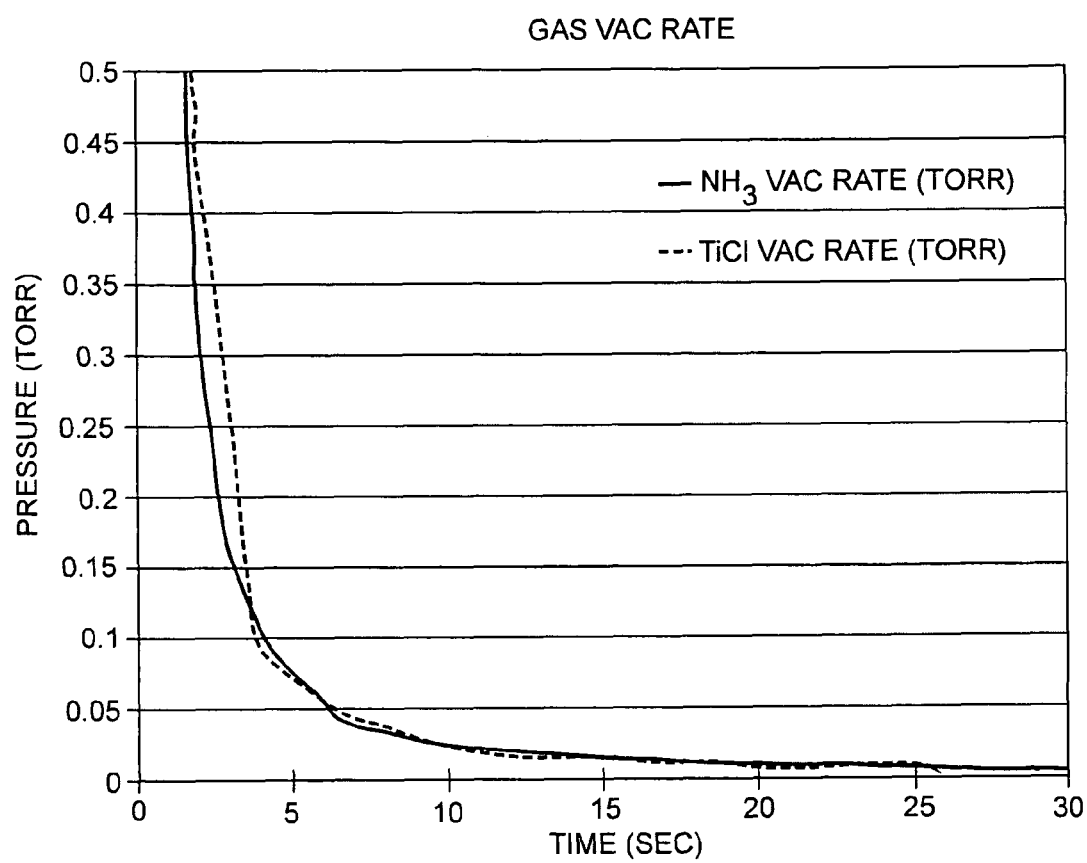
FIG. 13 shows a graph of the pressure versus time for the first portion of a purge cycle in accordance with an embodiment of the invention.
Figure 14:
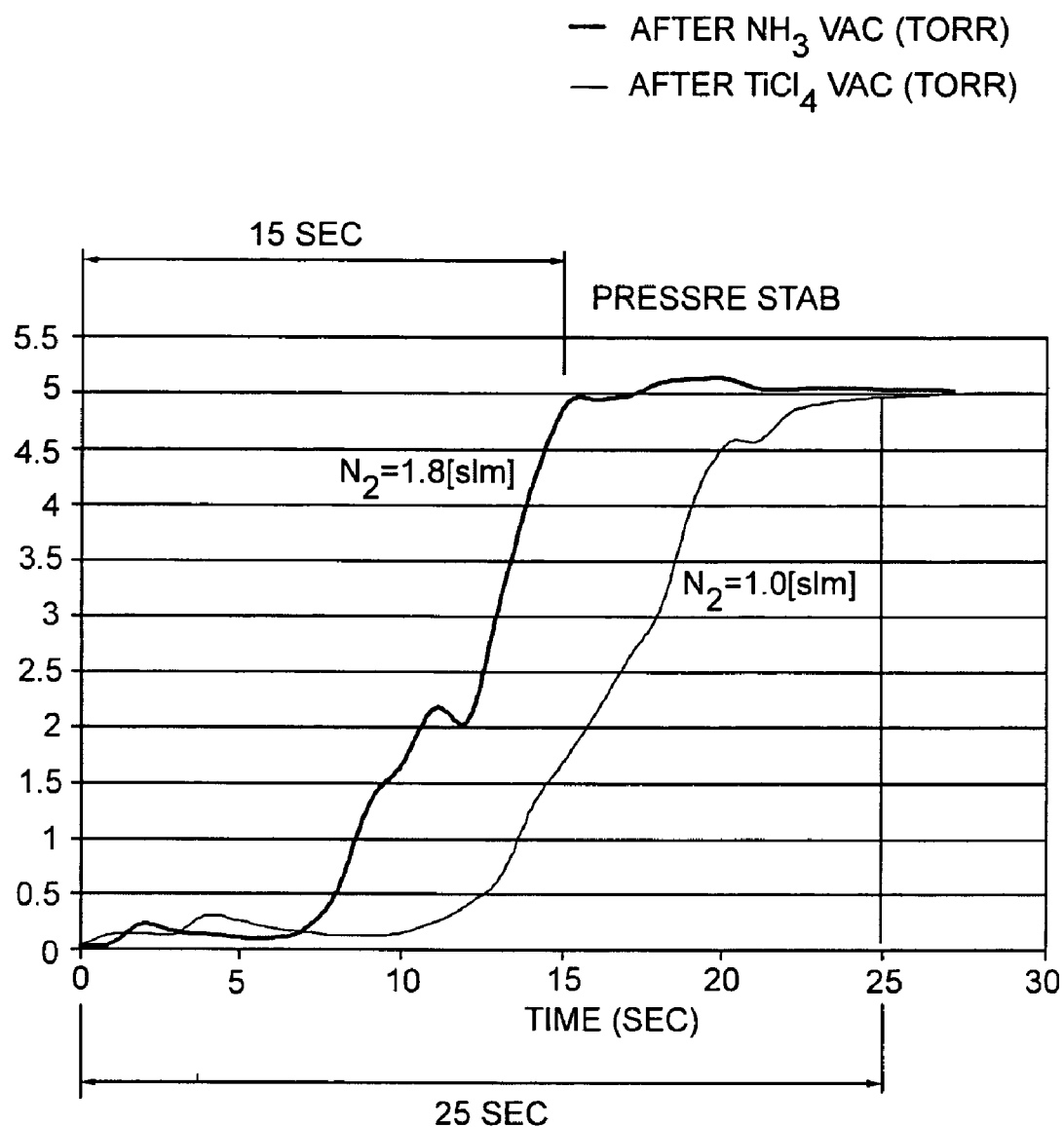
FIG. 14 shows a graph of pressure stabilization times for two exemplary purging processes in accordance with an embodiment of the invention.

In an alternate embodiment, intelligent set points can be used to control the chamber pressure during the first chamber purging process 830. FIG. 13 shows a graph of the pressure versus time for the first portion of a purge cycle in accordance with an embodiment of the invention. FIG. 14 shows a graph of pressure stabilization times for two exemplary purging processes in accordance with an embodiment of the invention.

Referring again to FIG. 8, in step 840, a second deposition process can be performed. During the second deposition process, surface saturation zones can be determined on the surface of at least one of the plurality of wafers, and a third virtual sensor can be created for determining one or more parameters for one or more surface saturation zones.

A third process gas can be introduced into the processing chamber; the plurality of wafers can be exposed to a second reactant species (second precursor) contained in the third process gas during a third process time; and a substantially uniform film can be deposited onto the surfaces of the plurality of wafers. For example, the second precursor can react with a monolayer of the first precursor material that has been adsorbed on the surface of the plurality of wafers, thereby forming a monolayer of desired material, such as $Si_3N_4$, $Al_2O_3$, $Ta_2O_5$, and HfSiON on the surface of each of the plurality of wafers. The third process time can be determined using at least one of: the first virtual sensor, the second virtual sensor, the third virtual sensor, and measured data.

In one embodiment, a third virtual sensor can be created for determining a reaction state and can be used to determine when the surface reaction state has reached a desired value. The surface reaction state can be used to determine when the second precursor has completely reacted with the monolayer of the first precursor material on the surfaces of the plurality of wafers, and a substantially uniform film is deposited onto the surfaces of the plurality of wafers. Furthermore, a third process time can be determined using at least one of the feed forward data, the virtual sensor, the second virtual sensor, and the third virtual sensor.

The third virtual sensor can be created using a dynamic model having model components ($M_1$, $M_2$, $M_3$, and $M_4$), control inputs (U), disturbance inputs (D), regulated outputs (Z), and measured outputs (Y) as described in FIG. 5. The model structure may be expressed as $Z = M_1 U + M_3 D$ and $Y = M_2 U + M_4 D$. Alternately, a different expression for the model structure may be used.

For example, measured data can be obtained for U and Y; a value of D can be estimated using $Y = M_2 U + M_4 D_{est}$; and a value of Z can be estimated using $Z_{est} = M_1 U + M_3 D_{est}$. At least one control input (U) can be a gas flow for the third process gas, at least one disturbance input (D) can be an unmeasured variation, at least one measured output (Y) can be a gas concentration for the third process gas, and at least one regulated output (Z) can be a virtual sensor for determining a surface reaction state. In alternative embodiments of the invention, a different number of model components may be used, and the model components may be arranged with a different architecture.

Measured data can be obtained for at least one of the regulated output; and the dynamic model can be verified using the measured data. In one case, the measured data can be obtained using a MLMS, which can measure in-situ the concentration of reacted and/or un-reacted precursor species at multiple locations. In addition, the MLMS can be used to measure in-situ a surface reaction state and/or a layer thickness at multiple locations. Alternately, the measured data may be obtained using a GCS or other optical techniques.

Also, the dynamic model can include: modeling the flow of the third process gas within the processing chamber, wherein the third process gas comprises a second reactant species (second precursor molecules); modeling the flow between the wafers as a diffusion process; determining a residence time for the second reactant species (second precursor molecules); determining a second reactant species (second precursor molecules) concentration for one or more surface saturation zones; and determining a reaction rate for one or more surface saturation zones.

For example, the surface reaction state virtual sensor can measure percentages, and the second deposition process can end when the surface reaction state reaches approximately 100 percent. In alternate embodiments, different percentages can be used. In some cases, the deposition process is dependent on saturated surface reactions between a first precursor deposited on the surface of the wafers and a second precursor. For example, the process can be a self-limiting reaction.

In a typical recipe, process parameter set points, such as the flow rate of a precursor-containing gas (approximately 100 sccm), and chamber pressure (approximately 1 Torr) are held constant for a given period. The invention, however, uses intelligent set points that are dynamic and that can vary the flow rate around a nominal value as a function of time to provide additional degrees of freedom in achieving film uniformity. In alternate embodiments, intelligent set points can be used to control other process parameters, such as chamber pressure, chamber temperature, and substrate temperature during the second deposition process in step 840. In additional embodiments, a nominal value is not required. In other embodiments, a different nominal value can be used.

In one embodiment, a second precursor concentration can be determined using radial elements on at least one wafer and a second precursor concentration vector D can be defined at each one of the radial elements (n). Alternately, non-circular items can be processed and non-radial elements can be used.

$$D = \begin{bmatrix} D_1 \\ \vdots \\ D_n \end{bmatrix}$$

Variations in the second precursor concentration vector D may be minimized by using the dynamic set point trajectories. A model-based linear or nonlinear multivariable control approach may be used to model the concentration values for the second precursor in which the controller comprises a mathematical model of the system to be controlled. The multivariable controller may be based on any of the modern control design methods as discussed above. The second precursor concentration model may be either linear or nonlinear and either SISO or MIMO. The multivariable control approach (i.e., MIMO) considers all inputs and their effects on the outputs. Several other approaches for modeling the concentration values for the second precursor are available, such as physical models, and data-driven models.

In one embodiment, the flow rate set points for the second precursor are allowed to vary in a small window around the nominal value during the second precursor process step 840, and this provides additional degrees of freedom in achieving end-of-run precursor concentration uniformity. In other embodiments, additional set points are used during the second precursor process step 840. When modeling the concentration values for the second precursor using intelligent time-varying set point trajectories, the nominal set points for the flow rates for the second precursor can be parameterized into a vector of breakpoints; and can define a vector r, that contain intelligent set points ($r_1$-$r_m$) for the flow rates for the second precursor which are time-varying perturbations around the nominal set points:

$$r = \begin{bmatrix} r_1 \\ \vdots \\ r_m \end{bmatrix}$$

Alternately, one or more process variables can have intelligent time-varying set points, when intelligent set points are used during the second precursor process 840. For example, intelligent set points can be used to control chamber temperature, chamber pressure, process gas chemistry, and wafer temperature.

A process sensitivity matrix M can be created by making small perturbations at each of the breakpoints for each control zone. Using the model of the closed-loop system, the results caused by these perturbations can be determined. The resultant perturbations ($d_1$-$d_n$) in one process characteristic, such as the concentration levels for the second precursor, can then be written as:

$$\begin{bmatrix} d_1 \\ \vdots \\ d_n \end{bmatrix} = M \begin{bmatrix} r_1 \\ \vdots \\ r_m \end{bmatrix}$$

Now, the optimization task becomes one of finding the appropriate values of vector r, such that the resultant vector d removes the across-wafer variations seen in the vector D obtained from the nominal trajectory. For example, measured-data can be used to compute the sensitivity matrix M.

When creating intelligent set points, the resultant uniformity of the deposited layer on the wafers depends significantly on the reaction rate, the wafer temperature, the precursor concentration, and the partial pressure at various locations on the wafer surface. Methods for computing the reaction rate at across-wafer locations and the sensitivity of the surface reaction rate to flow set point variations have been described above. The nominal reaction state values ($C_1$-$C_n$) can be proportional to the nominal concentration levels for the second precursor ($D_1$-$D_n$), where $\alpha$ is the proportionality constant. In addition, the variation in the reaction state values ($c_1$-$c_n$) can be proportional to variation in the concentration levels for the second precursor ($d_1$-$d_n$), where $\alpha$ is the proportionality constant. Then, variation in the reaction state values can be written as:

$$\begin{bmatrix} c_1 \\ \vdots \\ c_n \end{bmatrix} = \alpha \cdot M \begin{bmatrix} r_1 \\ \vdots \\ r_m \end{bmatrix}$$

The variation in the reaction state values ($c_1$-$c_n$) and/or the variation in the concentration levels for the second precursor ($d_1$-$d_n$) across the surfaces of the wafers may be reduced by computing intelligent set point using the sensitivity matrix M. The intelligent set points may be optimized by solving a constrained quadratic optimization problem given by:

$$r_{min} \|d - \alpha \cdot Mr\|, \text{ where } r_{min} < r, r < r_{max}$$

Thus, the procedure to find the intelligent set points becomes:

1) Run the process using the nominal set points and find the concentration level for the second precursor and/or the reaction state values at the selected locations across at least one of the plurality of wafers. Precursor concentration can be measured using several methods; one such method is using optical sensors (OES, ODP); another method can use a MLMS.

2) Select the nominal value of the concentration level for the second precursor and create the variation vector d, Which is the difference between a desired value and the measurement data. In one embodiment, the desired value is a nominal value. Alternately, the desired value may be an average value, a minimum value, a maximum value, a 3-sigma value, or another computed value.

3) Solve the optimization problem shown above to find the intelligent set points, r.

4) Update the recipe with the intelligent set points found in the previous step and re-run the process. For example, updated values may be obtained by running an updated recipe.

5) Iterate until the desired uniformity is achieved. For example, the desired uniformity can comprise an average value, a minimum value, a maximum value, a 3-sigma value, or another computed value for a surface reaction state. After the iteration has converged and the desired uniformity is achieved, the results may be stored for subsequent use.

Figure 15:
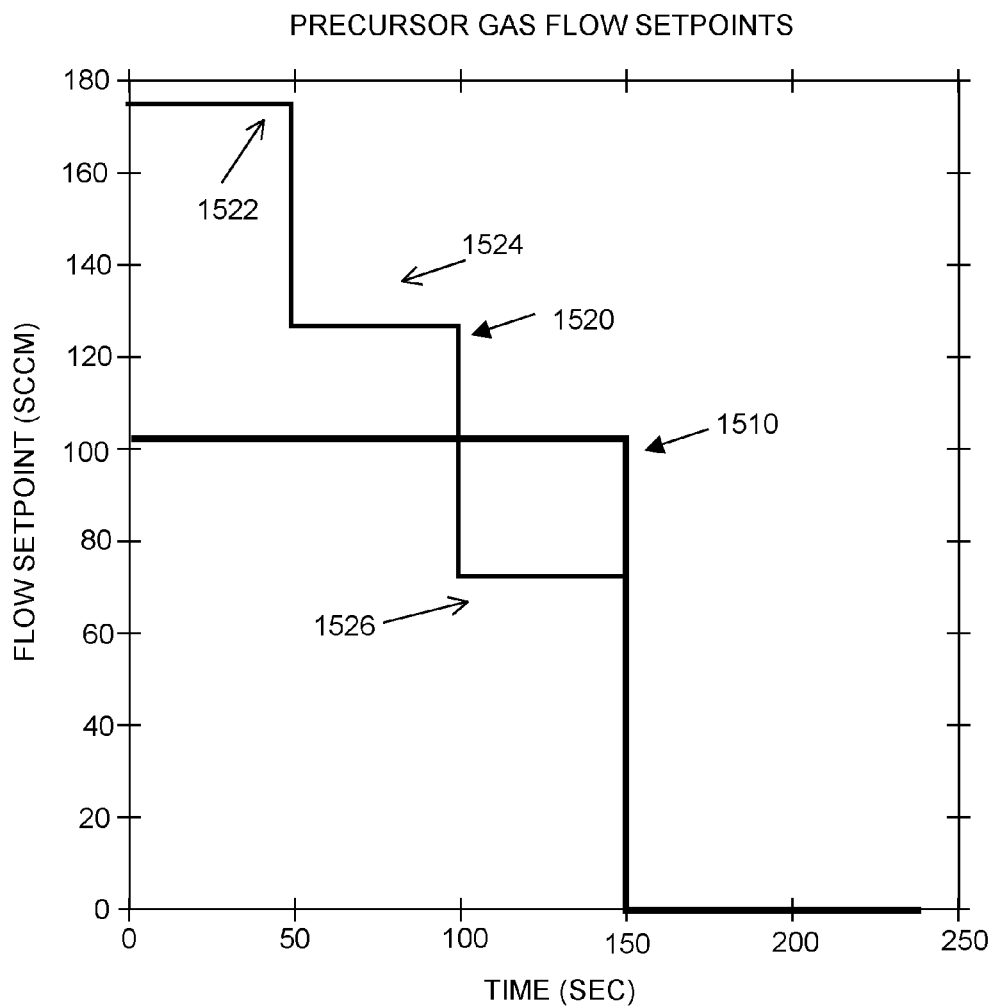
FIG. 15 illustrates a recipe step including gas flow rates for a second precursor-containing gas in accordance with an embodiment of the invention.

FIG. 15 illustrates a recipe step including gas flow rates for a second precursor-containing gas in accordance with an embodiment of the invention. A constant flow rate 1510 is shown that is typical of a commonly used ALD process of the prior art. A flow rate 1520 having intelligent set points (1522, 1524, and 1526) exemplifies an embodiment of the invention for operating a MLD process. In the illustrated embodiment, the flow rate for the second precursor-containing gas is stepped from one intelligent set point to another intelligent set point. In other embodiments, transitions between intelligent set points can be substantially linear. In alternate embodiments, a different number of intelligent set points can be used. In addition, different flow rate values can be used, and different times can be used.

Figure 16:
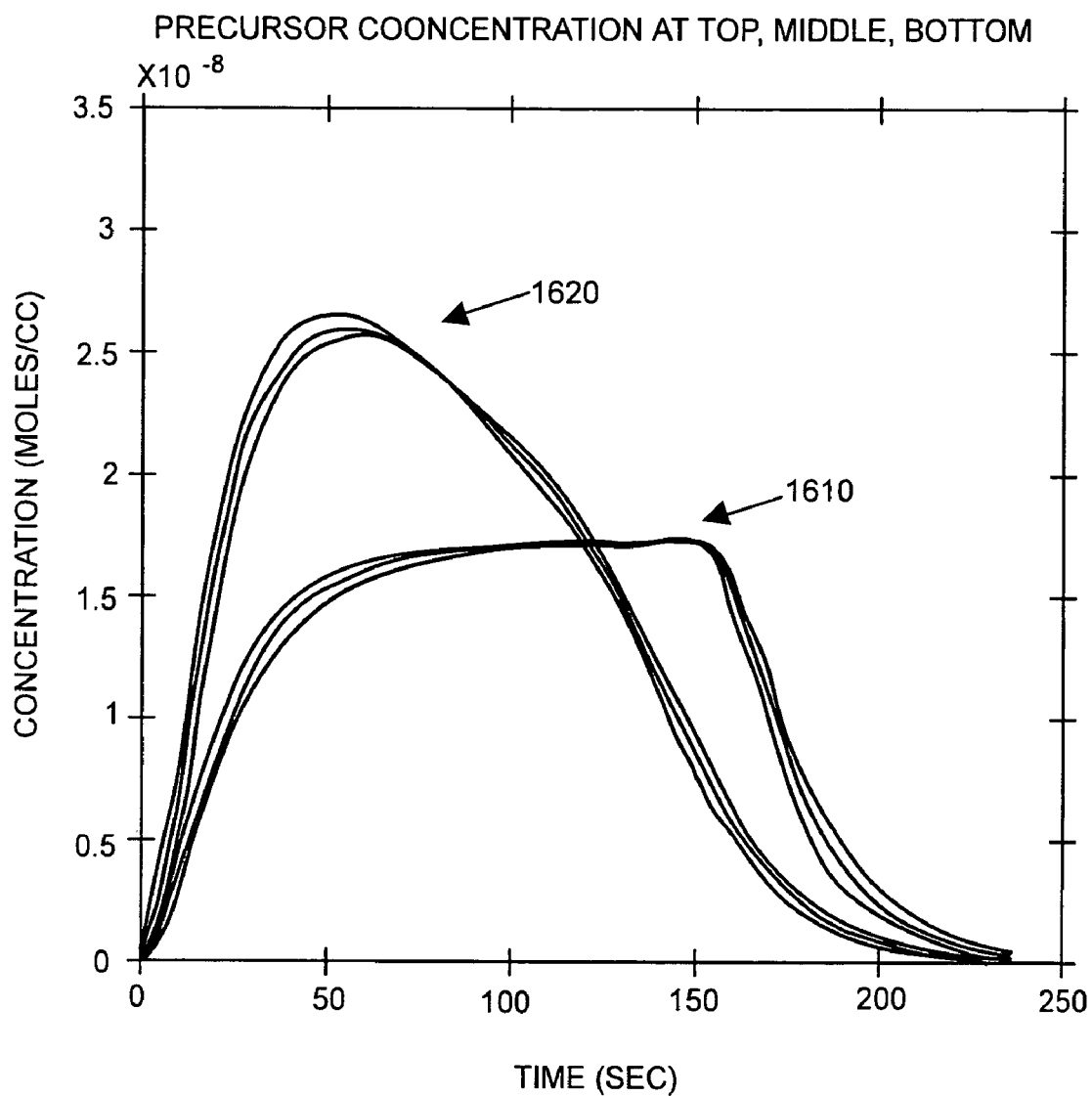
FIG. 16 illustrates concentration values for the second precursor in accordance with an embodiment of the invention.

FIG. 16 illustrates concentration values for the second precursor in accordance with an embodiment of the invention. Precursor concentration values 1610 are shown that are typical of a commonly used ALD process of the prior art in which the flow rate is held constant. Precursor concentration values 1620 are shown that exemplify an embodiment of the invention in which intelligent set points are used for operating a MLD process. In both cases (1610 and 1620), data is shown for wafers at the top, middle, and bottom of the stack. In alternate embodiments, different precursor concentration values can be used, and different times can be used.

Figure 17:
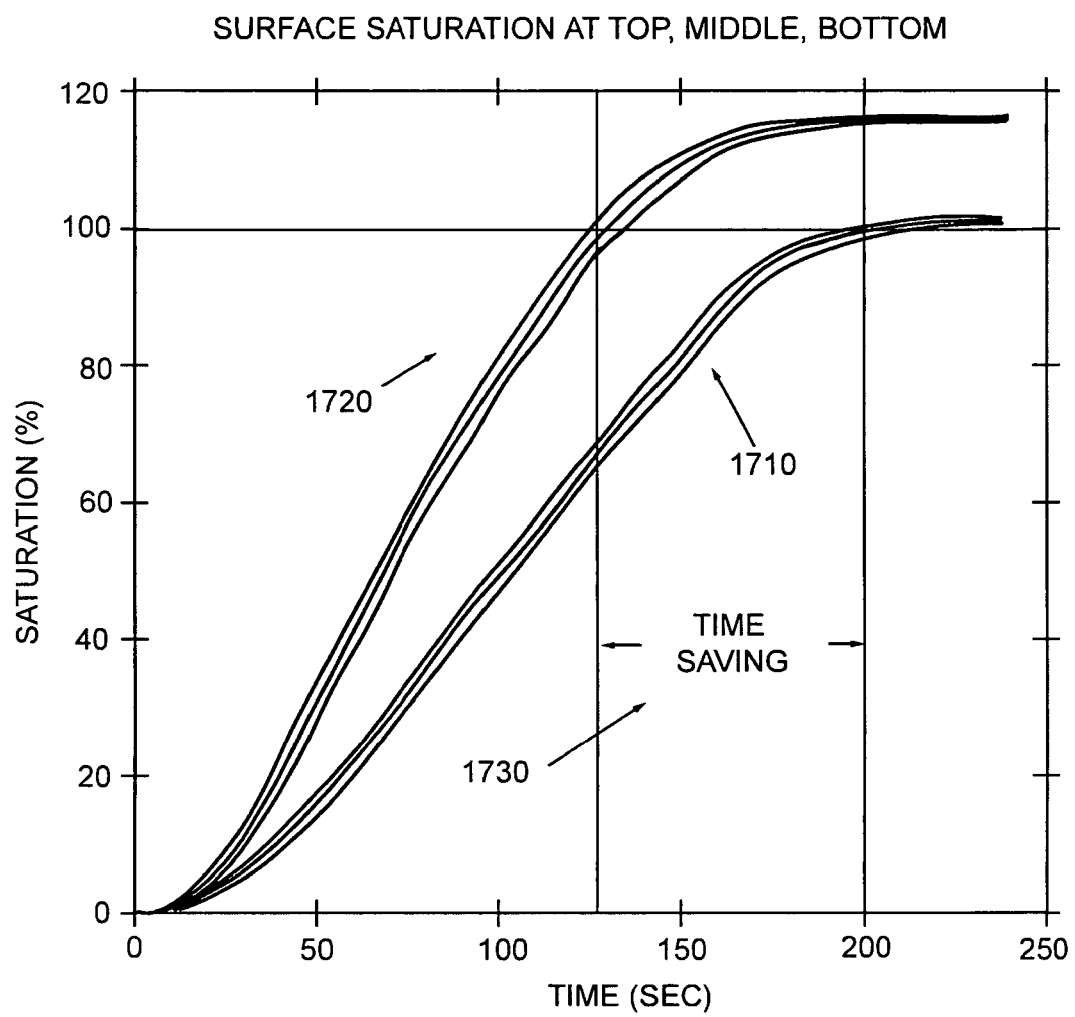
FIG. 17 illustrates surface saturation values for the second precursor in accordance with an embodiment of the invention.

FIG. 17 illustrates surface saturation values for the second precursor in accordance with an embodiment of the invention. Surface saturation values 1710 are shown that are typical of a commonly used ALD process of the prior art in which the flow rate is held constant. Surface saturation values 1720 are shown that exemplify an embodiment of the invention in which intelligent set points are used for operating a MLD process. In both cases (1710 and 1720), data is shown for wafers at the top, middle, and bottom of the stack. In alternate embodiments, different surface saturation values can be used, and different times can be used.

In addition, a time difference 1730 is shown that exemplifies the time savings obtained using an embodiment of the invention. Specifically, in the example, 100% saturation was achieved 75 seconds faster by virtue of the present invention. The use of intelligent set points provides a substantial time saving.

Referring again to FIG. 8, in step 850, a second chamber purging process can be performed. For example, a chamber purging process can include at least one of a chamber venting process, a chamber cleaning process, and an evacuation process. During the second chamber purging process 850, surface saturation zones can be determined on the surface of at least one of the plurality of wafers, and a fourth virtual sensor may be created for determining one or more parameters for one or more surface saturation zones. A fourth process gas can be introduced into the processing chamber during a fourth process time, and the fourth process gas can substantially eliminate the third process gas from the process chamber. For example, this can cause the concentration of the second reactant species (second precursor) at one or more surface saturation zones to be approximately zero. The fourth process time can be determined using at least one of the virtual sensor, the second virtual sensor, the third virtual sensor, the fourth virtual sensor, a concentration value, feed forward data, and measured data.

The fourth virtual sensor can be used to determine when at least one of a concentration level of un-reacted second precursor molecules, a concentration level of the third process gas, a concentration level of the fourth process gas, and a concentration level of by-products from the process reaches a desired value. In one embodiment, the desired value can be approximately zero. In alternate embodiments, the desired value can be greater than zero.

The fourth virtual sensor can be created using a dynamic model having model components ($M_1$, $M_2$, $M_3$, and $M_4$), control inputs (U), disturbance inputs (D), regulated outputs (Z), and measured outputs (Y) as described in FIG. 5. The model structure may be expressed as $Z=M_1U+M_3D$ and $Y=M_2U+M_4D$. Alternately, a different expression for the model structure may be used.

For example, measured data can be obtained for U and Y; a value of D can be estimated using $Y=M_2U+M_4D_{est}$; and a value of Z can be estimated using $Z_{est}=M_1U+M_3D_{est}$. At least one control input (U) can be a gas flow for the fourth process gas, where the fourth process gas comprises an inert gas, at least one disturbance input (D) can be an unmeasured variation, at least one measured output (Y) can be an un-reacted second precursor concentration for the gas leaving the processing chamber, and at least one regulated output (Z) can be a virtual sensor for determining the concentration of the un-reacted second precursor molecules and/or by-products at one or more surface saturation zones.

Measured data can be obtained for at least one of the regulated output; and the dynamic model can be verified using the measured data. In one embodiment, the measured data may be obtained using a GCS. In another embodiment, other measurement devices can be used. In an alternate embodiment, the GCS can be used as the endpoint detector for one or more process steps.

The virtual sensor for determining the concentration of the un-reacted second precursor molecules and/or by-products can measure percentages, and the second chamber purging process 850 can end when the concentration level of the un-reacted second precursor molecules and/or by-products reaches approximately zero percent. In alternate embodiments, different percentages can be used, and different concentrations can be used. In some cases, the purging process is dependent on the flow rates into the chamber, the flow rates out of the chamber, the flow rates within the chamber, and on the flow rates between the substrates.

In a typical recipe, process parameter set points, such as the flow rate of a purge gas, and chamber pressure are held constant for a known time during a purging process.

The invention, however, uses intelligent set points that are dynamic and that can vary the purge gas flow rate around a nominal value as a function of time to provide additional degrees of freedom in achieving film uniformity and faster processing times. In alternate embodiments, intelligent set points can be used to control other process parameters, such as chamber pressure, chamber temperature, and substrate temperature during the second purge process 850. In additional embodiments, a nominal value is not required. In other embodiments, a different nominal value can be used.

In one embodiment, the second purge step 850 is used to remove contaminants, such as the third process gas components, second precursor molecules, and/or process by-products from the wafer surfaces and from the processing chamber. Various reaction parameters can be combined with the dynamic model to determine the concentration levels for the contaminants at various locations during the second purge process 850. The concentration levels of the contaminants can be more accurately controlled by including intelligent set points to control the flow rate of the purge gas during the second chamber purging process 850.

In one embodiment, a second contamination level (concentration) can be determined using radial elements (n) on at least one wafer. A second contamination level can comprise at least one of a concentration level for un-reacted second precursor molecules, a concentration level for the third process gas, a concentration level for the fourth process gas, and a concentration level for the by-products from the process. A second contamination level (concentration) vector D can be defined at each one of the radial elements (n). Alternately, non-circular items can be processed and non-radial elements can be used.

$$D = \begin{bmatrix} D_1 \\ \vdots \\ D_n \end{bmatrix}$$

Variations in the second contamination vector D may be minimized by using the dynamic set point trajectories. A model-based linear or nonlinear multivariable control approach may be used to model the contamination levels in which the controller comprises a mathematical model of the system to be controlled. The multivariable controller may be based on any of the modern control design methods as described herein. The model of the contamination levels may be either linear or nonlinear and either SISO or MIMO. The multivariable control approach (i.e., MIMO) considers all inputs and their effects on the outputs. Several other approaches for modeling the contamination levels are available, such as physical models, and data-driven models.

In one embodiment, the flow rate set points for the fourth process gas are allowed to vary in a small window around the nominal value during the second purge process step 850, and this provides additional degrees of freedom in achieving faster and more efficient purging. In other embodiments, additional set points can be used during the second purge process step 850. When modeling the second contamination levels using intelligent time-varying set point trajectories, the nominal set points for flow rates for the fourth process gas can be parameterized into a vector of breakpoints; and can define a vector r, that contain intelligent set points ($r_1$-$r_m$) for flow rates for the fourth process gas which are time-varying perturbations around the nominal set points:

$$r = \begin{bmatrix} r_1 \\ \vdots \\ r_m \end{bmatrix}$$

Alternately, one or more process variables can have intelligent time-varying set points, when intelligent set points are used during the second purge process 850. For example, intelligent set points can be used to control chamber temperature, chamber pressure, fourth process gas chemistry, and wafer temperature.

A process sensitivity matrix M can be created by making small perturbations at each of the breakpoints for each control zone. Using the model of the closed-loop system, the results caused by these perturbations can be determined. The resultant perturbations ($d_1$-$d_n$) in one process characteristic, such as the second contamination levels (concentrations), can then be written as:

$$\begin{bmatrix} d_1 \\ \vdots \\ d_n \end{bmatrix} = M \begin{bmatrix} r_1 \\ \vdots \\ r_m \end{bmatrix}$$

Now, the optimization task becomes one of finding the appropriate values of vector r, such that the resultant vector d removes the across-wafer variations seen in the second contamination level (concentration) vector D obtained from the nominal trajectory. For example, measured data can be used to compute the sensitivity matrix M.

When creating intelligent set points, the resultant uniformity of the deposited layer on the wafers depends significantly on the effectiveness of the second purge process 850, which in turn depends on the flow rate for the fourth process gas (purge gas). Methods for computing the contamination levels at across-wafer locations and the sensitivity of the contamination levels to purge gas flow set point variations have been described above. In one embodiment, nominal second contamination state values ($C_1$-$C_n$) may be proportional to the nominal second contamination levels ($D_1$-$D_n$), where α is the proportionality constant. In addition, the variation in the second contamination state values ($c_1$-$c_n$) can be proportional to variation in the second contamination levels ($d_1$-$d_n$), where α is the proportionality constant. Then, variation in contamination state values ($c_1$-$c_n$) can be written as:

$$\begin{bmatrix} c_1 \\ \vdots \\ c_n \end{bmatrix} = \alpha \cdot M \begin{bmatrix} r_1 \\ \vdots \\ r_m \end{bmatrix}$$

The variation in the second contamination state values ($c_1$-$c_n$) and/or the variation in the second contamination levels ($d_1$-$d_n$) across the surfaces of the wafers may be reduced by computing intelligent set points using the sensitivity matrix M. The intelligent set points may be optimized by solving a constrained quadratic optimization problem given by:

$$r_{min} \|d - \alpha \cdot Mr\|, \text{ where } r_{min} < r, r < r_{max}$$

Thus, the procedure to find the intelligent set points becomes:

1) Run the process using the nominal set points and find the second contamination levels and/or second contamination state values across the surface of at least one wafer at the selected locations. The second contamination levels can be determined using several methods; one such method uses known gas analysis techniques; another method can use a GCS. Alternately, the measured data may be obtained using a MLMS.

2) Select the nominal value of the second contamination levels and create the variation vector d, which is the difference between the desired value and the measurement data. In one embodiment, the desired value is a nominal value. Alternately, the desired value may be an average value, a minimum value, a maximum value, a 3-sigma value, or another computed value.

3) Solve the optimization problem shown above to find the intelligent set points, r.

4) Update the recipe with the intelligent set points found in the previous step and re-run the process. For example, updated values may be obtained by running an Updated recipe.

5) Iterate until the desired second contamination level is achieved. For example, the desired contamination level can comprise at least one of a 3-sigma value, a maximum value, a minimum value, and an average value. After the iteration has converged and the desired uniformity is achieved, the results may be stored for subsequent use. At the completion of step 850, excess materials have been purged out of the chamber and a monolayer of a desired material, such as $Si_3N_4$, $Al_2O_3$, $Ta_2O_5$, and HfSiON has been deposited on the surface of the plurality of wafers.

In an alternate embodiment, intelligent set points can be used to control the chamber pressure during the second chamber purging process 850, similarly to the control for the first chamber purging process 830.

Figure 18:
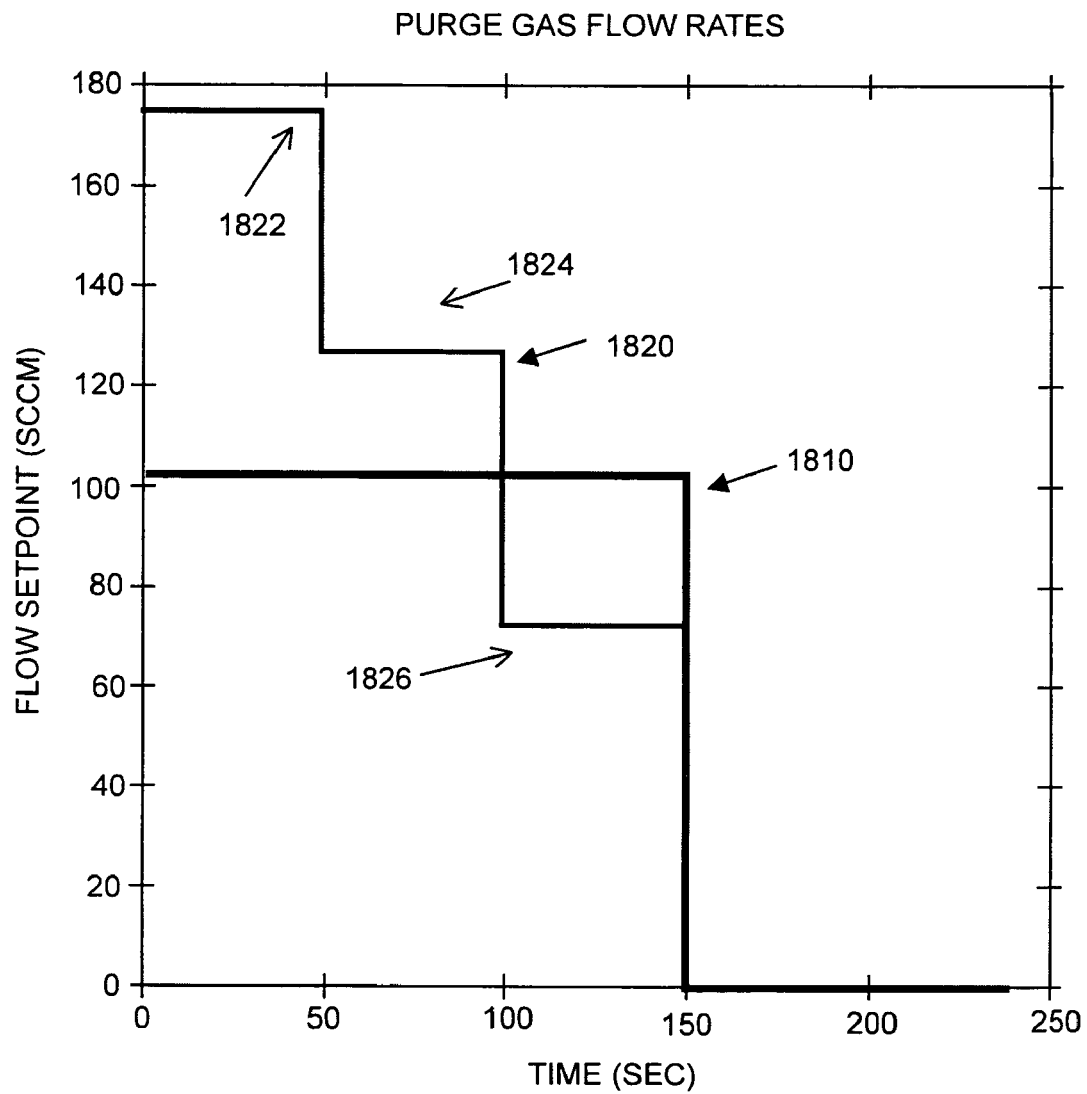
FIG. 18 illustrates a recipe step including gas flow rates for a second purge gas in accordance with an embodiment of the invention.

FIG. 18 illustrates a recipe step including gas flow rates for a second purge gas in accordance with an embodiment of the invention. A constant flow rate 1810 is shown that is typical of a commonly used ALD process of the prior art. A flow rate 1820 having intelligent set points (1822, 1824, and 1826) exemplifies an embodiment of the invention for operating a MLD process. In alternate embodiments, a different number of intelligent set points can be used. In addition, different flow rate values can be used, and different times can be used.

Referring again to FIGS. 13 and 14, FIG. 13 also shows a graph of the pressure versus time for the first portion of a second purge cycle, and FIG. 14 also shows a graph of the pressure versus time for the second portion of a second purge cycle.

Referring again to FIG. 8, in step 860, a query is performed to determine whether the MLD process is complete. When the MLD process is completed, procedure 800 ends in step 870. When the MLD process is not completed, procedure 800 branches back to step 820, and procedure 800 continues as shown in FIG. 8, with repetition of the precursor and purge steps 820 to 850, until the query of step 860 indicates that the MLD process has been completed.

In an MLD process, one or more monolayers can be deposited and the processing steps shown in FIG. 8 can be repeated a number of times. For example, a dynamic model can be created for determining when the MLD process has been completed.

In addition, an additional virtual sensor can be created for determining a film thickness for at least one surface saturation zone, and a process completion determination can be made using at least one of the feed forward data, the virtual sensor, the second virtual sensor, the third virtual sensor, the fourth virtual sensor, and the additional virtual sensor.

The invention can use process recipes that comprise dynamic models, virtual sensors, and/or intelligent set points to reduce variation within a wafer, reduce wafer-to-wafer variation, reduce lot-to-lot variations, and improve MLD throughput.

In general, real-life systems are dynamically complex and non-linear. Their transient responses are important for performance and are often hard to determine. The outputs of the system are affected by unknown disturbances. In general, for MIMO systems, each input (e.g., gas flow) can affect multiple outputs (e.g., gas flow, film thickness). In accordance with the invention, models are created that describe the dynamic behavior of a processing system, such as an MLD system.

Several approaches are available for creating dynamic models—these include: first principles models based on temperature, pressure, gas flow, and reaction kinetics, and on-line models created with real-time data collected from a processing system, such as a MLD processing system.

In a model methodology, a library of models can be created with known wafer parameters by using the data-driven on-line modeling, and the range of wafer variations expected can be covered using a set of models. During model development, a model may be implemented numerically on a suitable microprocessor in a suitable software simulation application, such as Matlab. The software application resides on a suitable electronic computer or microprocessor, which is operated to perform the physical performance approximation. However, other numerical methods are contemplated by the invention.

Numerous modifications and variations of the invention are possible in light of the above teachings. It is therefore to be understood that, within the scope of the appended claims, the invention may be practiced otherwise than as specifically described herein.

What is claimed is:

1. A method of operating a monolayer deposition (MLD) processing system comprising:

positioning a plurality of wafers in a spaced stack in a process chamber comprising a multi-orifice injection system having a plurality of injectors spaced along the spaced stack for distributing gas flow throughout the chamber and between the plurality of wafers;

performing a first precursor process by injecting a first precursor-containing gas through the multi-orifice injection system to create a plurality of first precursor gas flows therefrom, wherein the first precursor process is controlled by a first process recipe having a first set of intelligent time-varying set points, the first set of intelligent time-varying set points establishing at least a first flow rate for the plurality of first precursor gas flows during a first time period and a second flow rate for the plurality of first precursor gas flows during a second time period, wherein the plurality of first precursor gas flows is continuous from the first time period through at least the second time period, and wherein the at least first and second flow rates are different;

performing a first purge process, wherein the first purge process is controlled by a second process recipe having a second set of intelligent time-varying set points;

performing a second precursor process by injecting a second precursor-containing gas through the multi-orifice injection system to create a plurality of second precursor gas flows therefrom, wherein the second precursor process is controlled by a third process recipe having a third set of intelligent time-varying set points, the third set of intelligent time-varying set points establishing at least one of a third time-varying flow rate for the plurality of second precursor gas flows during a third time period or a fourth time-varying flow rate for the plurality of second precursor gas flows during a fourth time period, wherein the plurality of second precursor gas flows is continuous from the third time period through at least the fourth time period, and wherein the at least third and fourth flow rates are different;

performing a second purge process, wherein the second purge process is controlled by a fourth process recipe having a fourth set of intelligent time-varying set points; and repeating the performing steps until a film having a desired thickness is deposited on the plurality of wafers, wherein performing the first precursor process further comprises:

creating a first dynamic model for the first precursor process, the first dynamic model having first model components ($M_1$, $M_2$, $M_3$, and $M_4$), first control inputs (U), first disturbance inputs (D), first regulated outputs (Z), and first measured outputs (Y), and having a model structure comprising: $Z=M_1U+M_3D$ and $Y=M_2U+M_4D$, wherein the first control inputs (U) comprise the first time-varying flow rate for the plurality of first precursor gas flows, the second time-varying flow rate for the plurality of first precursor gas flows, a first flow time, a first precursor concentration, a first precursor type, a first chemisorption rate, a first reaction rate, a first pressure, or a first temperature, and any combination thereof;

wherein the first disturbance inputs (D) comprise first process drift, first chamber contamination, or first wafer temperature differences, or any combination thereof;

wherein the first measured outputs (Y) comprise incoming wafer temperature, incoming wafer composition, incoming wafer thickness, incoming wafer uniformity, output flow rate, precursor concentration at chamber output, precursor layer composition, or precursor layer uniformity, or any combination thereof; and wherein the first regulated outputs (Z) comprise one or more virtual sensors for determining a first precursor concentration level, a first precursor concentration uniformity value, a first saturation state value, or a first saturation state uniformity value, or any combination thereof.

2. The method of operating a MLD processing system as claimed in claim 1, the performing a first precursor process further comprising:

establishing surface saturation zones on a surface of at least one wafer;

determining a desired first precursor concentration level for at least one of the surface saturation zones; and depositing first precursor molecules into the surface saturation zones until the desired first precursor concentration level is achieved.

3. The method as claimed in claim 2, wherein a wafer comprises a circular shape and the surface saturation zones comprise a center zone and a plurality of annular ring-shaped zones radially spaced around the center zone.

4. The method as claimed in claim 2, wherein a wafer comprises a rectangular shape and the surface saturation zones comprise a plurality of uniformly spaced rectangular segments.

5. The method as claimed in claim 2, wherein a wafer comprises a rectangular shape and the surface saturation zones comprise a plurality of non-uniformly spaced rectangular segments.

6. The method of operating a MLD processing system as claimed in claim 1, the performing a first precursor process further comprising:

establishing surface saturation zones on a surface of at least one wafer;

determining a desired first precursor concentration level of first precursor molecules for at least one of the surface saturation zones;

using the one or more virtual sensors for estimating the first precursor concentration level for the at least one of the surface saturation zones, comparing the estimated first precursor concentration level to the desired first precursor concentration level; and depositing the first precursor molecules into the surface saturation zones until the estimated first precursor concentration level is approximately equal to the desired first precursor concentration level.

7. The method of operating a MLD processing system as claimed in claim 1, the performing a first precursor process further comprising:

establishing surface saturation zones on at least one wafer surface;

determining a desired first saturation state value for at least one of the surface saturation zones; and depositing first precursor molecules into the surface saturation zones until the desired first saturation state value is achieved.

8. The method of operating a MLD processing system as claimed in claim 7, wherein the desired first saturation state value is approximately one hundred percent.

9. The method of operating a MLD processing system as claimed in claim 1, the performing a first precursor process further comprising:

establishing surface saturation zones on a surface of at least one wafer;

determining a desired first saturation state value for at least one of the surface saturation zones;

using the one or more virtual sensors for estimating the first saturation state value for the at least one of the surface saturation zones, and comparing the estimated first saturation state value to the desired first saturation state value to determine when to stop flowing the first precursor-containing gas.

10. The method of operating a MLD processing system as claimed in claim 9, wherein the first precursor-containing gas comprises a first concentration during the first time period and comprises a second concentration during the second time period.

11. The method of operating a MLD processing system as claimed in claim 9, wherein the first precursor-containing gas comprises a first precursor during the first time period and comprises a second precursor during the second time period.

12. The method of operating a MLD processing system as claimed in claim 9, the first set of intelligent time-varying set points further establishing a first inert gas flow rate during the first time period and establishing a second inert gas flow rate during the second time period.

13. The method of operating a MLD processing system as claimed in claim 9, the first set of intelligent time-varying set points further establishing a first chamber pressure, a first chamber temperature, and a first substrate temperature for a first part of the first precursor process and establishing a second chamber pressure, a second chamber temperature, and a second substrate temperature for a second part of the first precursor process.

14. The method of operating a MLD processing system as claimed in claim 1, the performing a first precursor process further comprising chemisorbing precursor molecules onto a surface of at least one wafer.

15. The method of operating a MLD processing system as claimed in claim 14, the performing a first purge process further comprising:
   establishing surface saturation zones on the surface of the at least one wafer;
   determining a desired contamination state value for at least one of the surface saturation zones, the desired contamination state value being proportional to at least one of a concentration level of first unreacted precursor molecules, a concentration level of first reacted precursor molecules, a concentration level of the first precursor-containing gas, a purge gas concentration level, a concentration level of by-products from the first precursor process, and a concentration level of by-products from the first purge process; and
   flowing purge gas into the process chamber through the multi-orifice injection system until the desired contamination state value is achieved, wherein the desired contamination state value is approximately zero percent.

16. The method of operating a MLD processing system as claimed in claim 1, the performing a first purge process further comprising:
   establishing surface saturation zones on a surface of at least one wafer;
   determining a desired contamination level for at least one of the surface saturation zones, the desired contamination level being proportional to at least one of a concentration level of first un-reacted precursor molecules, a concentration level of first reacted precursor molecules, a concentration level of the first precursor-containing gas, a purge gas concentration level, a concentration level of by-products from the first precursor process, or a concentration level of by-products from the first purge process;
   using the one or more virtual sensors for estimating a contamination level for the at least one of the surface saturation zones,
   comparing the estimated contamination level to the desired contamination level; and
   flowing purge gas into the process chamber through the multi-orifice injection system until the estimated contamination level is approximately equal to the desired contamination level.

17. The method of operating a MLD processing system as claimed in claim 1, the second set of intelligent time-varying set points establishing at least a first purge gas flow rate during a first portion of the first purge process and a second purge gas flow rate during a second portion of the first purge process, wherein the purge gas flow is continuous during the first and second portions of the first purge process.

18. The method of operating a MLD processing system as claimed in claim 1, the second set of intelligent time-varying set points establishing at least one of a first chamber pressure, a first chamber temperature, and a first substrate temperature for a first part of the first purge process and a second chamber pressure, a second chamber temperature, and a second substrate temperature for a second part of the first purge process.

19. The method of operating a MLD processing system as claimed in claim 1, the performing a first purge process further comprising:
   creating a second dynamic model for the first purge process, the second dynamic model having second model components ($M_1$, $M_2$, $M_3$, and $M_4$), second control inputs (U), second disturbance inputs (D), second regulated outputs (Z), and second measured outputs (Y), and having a second model structure comprising: $Z=M_1U+M_3D$ and $Y=M_2U+M_4D$,
   wherein the second control inputs (U) comprise a first purge gas flow rate, a second purge gas flow rate, a second flow time, a first purge gas composition, the first precursor type, the first chemisorption rate, the first reaction rate, a second pressure, or a second temperature, or any combination thereof;
   wherein the second disturbance inputs (D) comprise second process drift, second chamber contamination, or second wafer temperature differences, or any combination thereof;
   wherein the second measured outputs (Y) comprise incoming wafer temperature, incoming wafer composition, incoming wafer thickness, incoming wafer uniformity, output flow rate, purge gas concentration at a chamber output, the precursor concentration at chamber output, the precursor layer composition, or the precursor layer uniformity, or any combination thereof; and
   wherein the second regulated outputs (Z) comprise the one or more virtual sensors for determining a contamination state, a concentration level of first un-reacted precursor molecules, a concentration level of process by-products, the first precursor concentration level, the first precursor concentration uniformity value, or a contamination state uniformity value, or any combination thereof.

20. The method of operating a MLD processing system as claimed in claim 19, the performing a second precursor process further comprising:
   establishing surface saturation zones on at least one wafer surface;
   determining a desired second precursor concentration level for at least one of the surface saturation zones; and
   depositing second precursor molecules into the surface saturation zones until the desired second precursor concentration level is achieved.

21. The method of operating a MLD processing system as claimed in claim 19, the performing a second precursor process further comprising:
   establishing surface saturation zones on at least one wafer surface;
   determining a desired second precursor concentration level of second precursor molecules for at least one of the surface saturation zones;
   using the one or more virtual sensors for estimating a second precursor concentration level for the at least one of the surface saturation zones;
   comparing the estimated second precursor concentration level to the desired second precursor concentration level; and
   depositing the second precursor molecules into the surface saturation zones until the estimated second precursor concentration level is approximately equal to the desired second precursor concentration level.

22. The method of operating a MLD processing system as claimed in claim 19, the performing a second precursor process further comprising:
   establishing surface saturation zones on at least one wafer surface;
   determining a desired reaction state value for at least one of the surface saturation zones; and
   depositing second precursor molecules into the surface saturation zones until the desired reaction state value is achieved.

23. The method of operating a MLD processing system as claimed in claim 22, wherein the desired reaction state value is approximately one hundred percent.

24. The method of operating a MLD processing system as claimed in claim 19, the performing a second precursor process further comprising:
establishing surface saturation zones on at least one wafer surface;
determining a desired reaction state value for at least one of the surface saturation zones;
using the one or more virtual sensors for estimating a reaction state value for the at least one of the surface saturation zones;
comparing the estimated reaction state value to the desired reaction state value; and
depositing second precursor molecules into the surface saturation zones until the estimated reaction state value is approximately equal to the desired reaction state value.

25. The method of operating a MLD processing system as claimed in claim 19, wherein the second precursor-containing gas comprises a first concentration during the third time period and comprises a second concentration during the fourth time period.

26. The method of operating a MLD processing system as claimed in claim 19, wherein the second precursor-containing gas comprises a first precursor during the third time period and comprises a second precursor during the fourth time period.

27. The method of operating a MLD processing system as claimed in claim 19, the third set of intelligent time-varying set points further establishing at least one of a first inert gas flow rate for a first inert gas during the third time period and a second inert gas flow rate for a second inert gas during the fourth time period.

28. The method of operating a MLD processing system as claimed in claim 19, the third set of intelligent time-varying set points further establishing at least one of a first chamber pressure, a first chamber temperature, and a first substrate temperature for a first part of the second precursor process and a second chamber pressure, a second chamber temperature, and a second substrate temperature for a second part of the second precursor process.

29. The method of operating a MLD processing system as claimed in claim 1, the performing a second precursor process further comprising:
creating a third dynamic model for the second precursor process, the third dynamic model having third model components ($M_1$, $M_2$, $M_3$, and $M_4$), third control inputs (U), third disturbance inputs (D), third regulated outputs (Z), and third measured outputs (Y), and having a third model structure comprising: $Z=M_1U+M_3D$ and $Y=M_2U+M_4D$,
wherein the third control inputs (U) comprise the third flow rate for the plurality of second precursor gas flows, the fourth flow rate for the plurality of second precursor gas flows, a third flow time, a second precursor concentration, a second precursor type, a second chemisorption rate, a second reaction rate, a third pressure, or a third temperature, or any combination thereof;
wherein the third disturbance inputs (D) comprise third process drift, third chamber contamination, or third wafer temperature differences, or any combination thereof;
wherein the third measured outputs (Y) comprise incoming wafer temperature, incoming wafer composition, incoming wafer thickness, incoming wafer uniformity, output flow rate, the precursor concentration at chamber output, the precursor layer composition, or the precursor layer uniformity, or any combination thereof; and
wherein the third regulated outputs (Z) comprise the one or more virtual sensors for determining a second precursor concentration level, a second precursor concentration uniformity value, a second saturation state value, a second saturation state uniformity value, a reaction state value, or a reaction state uniformity value, or any combination thereof.

30. The method of operating a MLD processing system as claimed in claim 29, the performing a second precursor process further comprising reacting molecules of the second precursor-containing gas with chemisorbed precursor molecules from the first precursor-containing gas on a surface of at least one wafer.

31. The method of operating a MLD processing system as claimed in claim 29, the performing a second purge process further comprising:
establishing surface saturation zones on a surface of at least one wafer;
determining a desired contamination state value for at least one of the surface saturation zones, the desired contamination state value being proportional to at least one of a concentration level of second un-reacted precursor molecules, a concentration level of second reacted precursor molecules, a concentration level of the second precursor-containing gas, a purge gas concentration level, a concentration level of by-products from the second precursor process, and a concentration level of by-products from the second purge process; and
flowing purge gas into the process chamber through the multi-orifice injection system until the desired contamination state value is achieved, wherein the desired contamination state value is approximately zero percent.

32. The method of operating a MLD processing system as claimed in claim 29, the performing a second purge process further comprising:
establishing surface saturation zones on the surface of at least one wafer;
determining a desired contamination level for at least one of the surface saturation zones, the desired contamination level being proportional to at least one of a concentration level of second un-reacted precursor molecules, a concentration level of second reacted precursor molecules, a concentration level of the second precursor-containing gas, the purge gas concentration level, a concentration level of by-products from the second precursor process, and a concentration level of by-products from the second purge process;
using the one or more virtual sensors for estimating a contamination level for the at least one of the surface saturation zones,
comparing the estimated contamination level to the desired contamination state value; and
flowing purge gas into the process chamber through the multi-orifice injection system until the estimated contamination level is approximately equal to the desired contamination level.

33. The method of operating a MLD processing system as claimed in claim 29, the fourth set of intelligent time-varying set points establishing at least one of a first purge gas flow rate during a first portion of the second purge process and a second purge gas flow rate during a second portion of the second purge process, wherein the purge gas flow is continuous during the first and second portions of the second purge process.

34. The method of operating a MLD processing system as claimed in claim 29, the fourth set of intelligent time-varying set points further establishing at least one of a first chamber pressure, a first chamber temperature, and a first substrate temperature for a first part of the second purge process and a second chamber pressure, a second chamber temperature, and a second substrate temperature for a second part of the second purge process.

35. The method of operating a MLD processing system as claimed in claim 1, the performing a second purge process further comprising:

creating a fourth dynamic model for the second purge process, the fourth dynamic model having fourth model components ($M_1$, $M_2$, $M_3$, and $M_4$), fourth control inputs (U), fourth disturbance inputs (D), fourth regulated outputs (Z), and fourth measured outputs (Y), and having a fourth model structure comprising: $Z=M_1U+M_3D$ and $Y=M_2U+M_4D$, wherein the fourth control inputs (U) comprise a first purge gas flow rate, a second purge gas flow rate, a fourth flow time, a purge gas composition, a second precursor type, a second chemisorption rate, a second reaction rate, a fourth pressure, or a fourth temperature, or any combination thereof;

wherein the fourth disturbance inputs (D) comprise fourth process drift, fourth chamber contamination, or fourth wafer temperature differences, or any combination thereof;

wherein the fourth measured outputs (Y) comprise incoming wafer temperature, incoming wafer composition, incoming wafer thickness, incoming wafer uniformity, output flow rate, purge gas concentration at a chamber output, the precursor concentration at a chamber output, the precursor layer composition, or the precursor layer uniformity, or any combination thereof; and wherein the fourth regulated outputs (Z) comprise the one or more virtual sensors for determining a contamination state, a concentration level of second un-reacted precursor molecules, a concentration level of second reacted precursor molecules, a concentration level of process by-products, a second precursor concentration value, a second precursor concentration uniformity value, or a contamination state uniformity value, or any combination thereof.

36. The method of operating a MLD processing system as claimed in claim 35, the performing a first precursor process further comprising:

providing a plurality of precursor molecules using the first precursor-containing gas injected through the multi-orifice injection system;

modeling precursor molecule flow between the wafers as a diffusion process;

determining a residence time for first precursor molecules; and determining the chemisorption rate for the first precursor molecules.

37. The method as claimed in claim 1, further comprising:
receiving feed forward data for at least one of the wafers;
extracting refractive index (n) data and extinction coefficient (k) data from the feed forward data; and
determining wafer composition using the refractive index (n) data and extinction coefficient (k) data.

38. The method as claimed in claim 37, wherein the feed forward data comprises wafer composition information that includes at least one of: the number of layers, layer position, layer composition, layer uniformity, layer density, layer thickness, critical dimension (CD) information and profile information for at least one wafer, critical dimension (CD) information and profile information for at least one wafer, or data for a plurality of locations non-radially positioned on at least one wafer, or any combination thereof.

* * * * *

UNITED STATES PATENT AND TRADEMARK OFFICE
CERTIFICATE OF CORRECTION

PATENT NO. : 7,838,072 B2  
APPLICATION NO. : 11/043199  
DATED : November 23, 2010  
INVENTOR(S) : Sanjeev Kaushal et al.

Page 1 of 1

It is certified that error appears in the above-identified patent and that said Letters Patent is hereby corrected as shown below:

Drawing Sheet 7 of 15, FIG. 10, "PRECURSOR COONCENTRATION AT TOP, MIDDLE, BOTTOM" should read --PRECURSOR CONCENTRATION AT TOP, MIDDLE, BOTTOM--.

Drawing Sheet 11 of 15, FIG. 14, "PRESSRE STAB" should read --PRESSURE STAB--.

Drawing Sheet 13 of 15, FIG. 16, "PRECURSOR COONCENTRATION AT TOP, MIDDLE, BOTTOM" should read --PRECURSOR CONCENTRATION AT TOP, MIDDLE, BOTTOM--.

Col. 9, line 50, "areas can different" should read --areas can be different--.

Col. 13, line 26, "set point" should read --set points--.

Col. 16, line 31, "contain" should read --contains--.

Col. 20, line 3, "contain" should read --contains--.

Col. 20, line 64, "set point" should read --set points--.

Col. 21, line 10, "vector d, Which" should read --vector d, which--.

Col. 23, line 67, "contain" should read --contains--.

Col. 34, lines 31-33, "critical dimension (CD) information and profile information for at least one wafer, critical dimension (CD) information and profile information for at least one wafer, or" should read --critical dimension (CD) information and profile information for at least one wafer, or--.

Signed and Sealed this  
First Day of March, 2011

David J. Kappos  
*Director of the United States Patent and Trademark Office*